United States Patent
Gopalan et al.

(10) Patent No.: US 10,229,729 B2
(45) Date of Patent: **\*Mar. 12, 2019**

(54) METHOD FOR CALIBRATING CAPTURING READ DATA IN A READ DATA PATH FOR A DDR MEMORY INTERFACE CIRCUIT

(71) Applicant: Uniquify, Inc., San Jose, CA (US)

(72) Inventors: Mahesh Gopalan, Milpitas, CA (US); David Wu, Saratoga, CA (US); Venkat Iyer, Sunnyvale, CA (US)

(73) Assignee: Uniquify IP Company, LLC, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/722,209

(22) Filed: Oct. 2, 2017

(65) Prior Publication Data
US 2018/0033477 A1   Feb. 1, 2018

Related U.S. Application Data

(63) Continuation of application No. 15/249,188, filed on Aug. 26, 2016, now Pat. No. 9,805,784, which is a
(Continued)

(51) Int. Cl.
*G11C 11/4076* (2006.01)
*G11C 11/4096* (2006.01)
(Continued)

(52) U.S. Cl.
CPC ............ *G11C 11/4076* (2013.01); *G06F 1/04* (2013.01); *G06F 1/08* (2013.01); *G06F 1/12* (2013.01);
(Continued)

(58) Field of Classification Search
CPC ... G11C 11/4076; G11C 7/1072; G11C 7/222; G11C 11/4096; G11C 29/022;
(Continued)

(56) References Cited

U.S. PATENT DOCUMENTS

| 5,157,530 A | 10/1992 | Loeb et al. |
| 5,548,620 A | 8/1996 | Rogers |

(Continued)

FOREIGN PATENT DOCUMENTS

JP   2011059762 A   3/2011

OTHER PUBLICATIONS

Application Note—High Performance DDR3 SDRAM Interface in Virtex-5 Devices, Xilinx Corporation, Sep. 27, 2007, pp. 1-11.
(Continued)

*Primary Examiner* — Fernando Hidalgo
(74) *Attorney, Agent, or Firm* — Zilka-Kotab, PC

(57) ABSTRACT

A method for calibrating capturing read data in a read data path for a DDR memory interface circuit is described. In one version, the method includes the steps of delaying a core clock signal by a capture clock delay value to produce a capture clock signal and determining the capture clock delay value. The capture clock signal is a delayed version of the core clock signal. The timing for the read data path with respect to data propagation is responsive to at least the capture clock signal. In another version, timing for data capture is responsive to a read data strobe or a signal derived therefrom, and a core clock signal or a signal derived therefrom.

135 Claims, 26 Drawing Sheets

Related U.S. Application Data continuation of application No. 14/882,226, filed on Oct. 13, 2015, now Pat. No. 9,431,091, which is a continuation-in-part of application No. 14/752,903, filed on Jun. 27, 2015, now Pat. No. 9,552,853, which is a continuation of application No. 14/152,902, filed on Jan. 10, 2014, now Pat. No. 9,081,516, which is a continuation of application No. 14/023,630, filed on Sep. 11, 2013, now Pat. No. 8,843,778, which is a continuation of application No. 13/172,740, filed on Jun. 29, 2011, now Pat. No. 8,661,285, which is a continuation-in-part of application No. 12/157,081, filed on Jun. 6, 2008, now Pat. No. 7,975,164.

(60) Provisional application No. 62/063,136, filed on Oct. 13, 2014.

(51) Int. Cl.

| | | |
|---|---|---|
| *G06F 3/06* | (2006.01) | |
| *G06F 12/06* | (2006.01) | |
| *G06F 13/16* | (2006.01) | |
| *G06F 13/42* | (2006.01) | |
| *G06F 1/04* | (2006.01) | |
| *G06F 1/08* | (2006.01) | |
| *G06F 1/12* | (2006.01) | |
| *G06F 1/14* | (2006.01) | |
| *G11C 7/10* | (2006.01) | |
| *G11C 7/22* | (2006.01) | |
| *G11C 29/02* | (2006.01) | |
| *G11C 11/4093* | (2006.01) | |
| *G11C 7/04* | (2006.01) | |
| *G11C 11/40* | (2006.01) | |

(52) U.S. Cl.
CPC .............. *G06F 1/14* (2013.01); *G06F 3/065* (2013.01); *G06F 3/067* (2013.01); *G06F 3/0619* (2013.01); *G06F 12/0646* (2013.01); *G06F 13/1689* (2013.01); *G06F 13/4243* (2013.01); *G11C 7/1072* (2013.01); *G11C 7/222* (2013.01); *G11C 11/4093* (2013.01); *G11C 11/4096* (2013.01); *G11C 29/022* (2013.01); *G11C 29/023* (2013.01); *G11C 29/028* (2013.01); *G11C 7/04* (2013.01); *G11C 11/40* (2013.01)

(58) Field of Classification Search
CPC ....... G11C 29/023; G11C 29/028; G11C 7/04; G11C 11/40; G06F 1/04; G06F 1/08; G06F 1/12; G06F 1/14; G06F 3/0619; G06F 3/065; G06F 3/067; G06F 12/0646; G06F 13/1689; G06F 13/4243
USPC ............... 365/193, 189.011, 189.17, 189.05, 365/233.13, 233.18, 244
See application file for complete search history.

(56) References Cited

U.S. PATENT DOCUMENTS

| | | |
|---|---|---|
| 6,316,980 B1 | 11/2001 | Vogt et al. |
| 6,370,067 B1 | 4/2002 | Ko et al. |
| 6,442,102 B1 | 8/2002 | Lee et al. |
| 6,509,762 B1 | 1/2003 | Moss et al. |
| 6,510,503 B2 | 1/2003 | Gillingham et al. |
| 6,570,815 B2 | 5/2003 | Kashiwazaki |
| 6,646,929 B1 | 11/2003 | Moss et al. |
| 6,779,128 B1 | 8/2004 | Gale et al. |
| 6,864,715 B1 | 3/2005 | Bauer et al. |
| 6,940,768 B2 | 9/2005 | Dahlberg et al. |
| 6,972,998 B1 | 12/2005 | Gibson et al. |
| 7,043,652 B2 | 5/2006 | Matsui |
| 7,054,401 B2 | 5/2006 | Kada et al. |
| 7,123,051 B1 | 10/2006 | Lee et al. |
| 7,157,948 B2 | 1/2007 | McClannahan et al. |
| 7,171,321 B2 | 1/2007 | Best |
| 7,177,230 B1 | 2/2007 | Huang |
| 7,177,379 B1 | 2/2007 | Shihadeh |
| 7,209,531 B1 | 4/2007 | Katz et al. |
| 7,215,584 B2 | 5/2007 | Butt et al. |
| 7,222,036 B1 | 5/2007 | Thorne |
| 7,240,249 B2 | 7/2007 | Buchmann et al. |
| 7,259,606 B2 | 8/2007 | Ku et al. |
| 7,318,167 B2 | 1/2008 | Li et al. |
| 7,342,838 B1 | 3/2008 | Sharpe-Geisler et al. |
| 7,366,862 B2 | 4/2008 | Nystuen et al. |
| 7,405,984 B2 | 7/2008 | Hughes |
| 7,441,139 B2 | 10/2008 | Kuwata |
| 7,454,303 B2 | 11/2008 | Magee et al. |
| 7,493,461 B1 | 2/2009 | Thorne |
| 7,543,172 B2 | 6/2009 | Kizer et al. |
| 7,558,151 B1 | 7/2009 | Svoiski |
| 7,567,104 B2 | 7/2009 | Ku et al. |
| 7,571,277 B2 | 8/2009 | Mizushima |
| 7,571,396 B2 | 8/2009 | Hughes et al. |
| 7,590,008 B1 | 9/2009 | Roge et al. |
| 7,593,273 B2 | 9/2009 | Chu et al. |
| 7,647,467 B1 | 1/2010 | Hutsell et al. |
| 7,724,606 B2 | 5/2010 | Osawa et al. |
| 7,739,539 B2 | 6/2010 | Vergnes et al. |
| 7,791,375 B2 | 9/2010 | Clarke |
| 7,818,528 B2 | 10/2010 | Hughes |
| 7,849,345 B1 | 12/2010 | Swarnkar et al. |
| 7,924,637 B2 | 4/2011 | Searles et al. |
| 7,957,218 B2 | 6/2011 | Welker |
| 7,975,164 B2 | 7/2011 | Lee et al. |
| 8,086,813 B2 | 12/2011 | Gillingham et al. |
| 8,121,237 B2 | 2/2012 | Stott et al. |
| 8,134,878 B1 | 3/2012 | Shimanek et al. |
| 8,139,430 B2 | 3/2012 | Buchmann et al. |
| 8,151,133 B2 | 4/2012 | Kizer et al. |
| 8,159,888 B2 | 4/2012 | Raghunathan et al. |
| 8,237,475 B1 | 8/2012 | Nagarajan et al. |
| 8,284,621 B2 | 10/2012 | Dreps et al. |
| 8,300,464 B2 | 10/2012 | Welker et al. |
| 8,347,020 B2 | 1/2013 | Maddali et al. |
| 8,423,813 B2 | 4/2013 | Huang |
| 8,565,033 B1 | 10/2013 | Manohararajah et al. |
| 8,588,014 B1 | 11/2013 | Fung et al. |
| 8,775,701 B1 | 7/2014 | Fung |
| 8,897,084 B2 | 11/2014 | Chen et al. |
| 8,947,140 B2 * | 2/2015 | Iyer .......................... H03L 7/10 327/158 |
| 10,032,502 B1 | 7/2018 | Gopalan et al. |
| 2003/0041295 A1 | 2/2003 | Hou et al. |
| 2003/0236641 A1 | 12/2003 | Liou |
| 2004/0123207 A1 | 6/2004 | Zumkehr et al. |
| 2005/0005056 A1 | 1/2005 | Ware |
| 2005/0114725 A1 | 5/2005 | Patel |
| 2005/0138277 A1 | 6/2005 | Koo |
| 2006/0107011 A1 | 5/2006 | Nystuen et al. |
| 2006/0184817 A1 | 8/2006 | Dreps et al. |
| 2007/0019561 A1 | 1/2007 | Peterson |
| 2007/0028255 A1 | 2/2007 | Ito et al. |
| 2008/0005518 A1 | 1/2008 | Gillingham et al. |
| 2008/0010479 A1 | 1/2008 | Fortin et al. |
| 2008/0068911 A1 | 3/2008 | Hughes et al. |
| 2008/0094918 A1 | 4/2008 | Fujizoe |
| 2008/0276133 A1 | 11/2008 | Hadley et al. |
| 2009/0168563 A1 | 7/2009 | Jiang |
| 2010/0238747 A1 | 9/2010 | Chen et al. |
| 2010/0271094 A1 | 10/2010 | Hassan |
| 2011/0239030 A1 | 9/2011 | Ware et al. |
| 2011/0249522 A1 | 10/2011 | Welker et al. |
| 2011/0258475 A1 | 10/2011 | Lee et al. |
| 2011/0298511 A1 | 12/2011 | Swanson et al. |
| 2012/0170389 A1 | 7/2012 | Kizer et al. |
| 2012/0218841 A1 | 8/2012 | Hunt |

(56) References Cited

U.S. PATENT DOCUMENTS

| | | |
|---|---|---|
| 2018/0211699 A1 | 7/2018 | Gopalan et al. |
| 2018/0277195 A1 | 9/2018 | Gopalan et al. |
| 2018/0336942 A1 | 11/2018 | Gopalan et al. |

OTHER PUBLICATIONS

White Paper—Utilizing Leveling Techniques in DDR3 SDRAM Memory Interfaces, Altera Corp., Nov. 2007, pp. 1-7.
White Paper—The Love/Hate Relationship with DDR SDRAM Controllers, Mosaid Technologies, Oct. 2006, pp. 1-8.
Altera, "AN 436: Using DDR3 SDRAM in Stratix III and Stratix IV Devices", 59 pages, Nov. 2008.
Lattice Semiconductor, "Implementing High-Speed DDR3 Memory Controllers in a Mid Range FPGA", 9 pages, Date Unknown.
Everything Explained.AT—CAS Latency Explained, 1 page, A.B. Cryer—2009-2011.
Altera "AN 552: Using DDR and DDR2 SDRAM in Arria II GX Devices", 48 pages, Feb. 2009.
Texas Instruments, "AM17x/AM18x ARM Microprocessor DDR2/mDDR Memory Controller", 66 Pages, Apr. 2011.
Altera, "Cyclone II Device Handbook, vol. 1," Altera Corporation, 2008, 470 pages.
Altera, "External Memory Interfaces in Cyclone III Devices," Altera Corporation, Cyclone III Device Handbook, vol. 1, Chapter 9, Oct. 2008, 18 pages.
Altera, "Cyclone III Device Handbook, vol. 1 & vol. 2" Altera Corporation, 2007, 514 pages.
Altera "Cyclone III Device Handbook, vol. 1 & vol. 2" Altera Corporation, 2008, 528 pages.
Altera, "External Memory Interface Handbook vol. 1: Introduction to Altera External Memory Interfaces," Altera Corporation, Jan. 2010, 1170 pages.
Altera,"Section I. DDR and DDR2 SDRAM High-Performance Controllers and ALTMEMPHY IP User Guide," Altera Corporation, Feb. 2010, 184 pages.
Altera, "External Memory Interface Handbook vol. 4: Simulation, Timing Analysis, and Debugging," Altera Corporation, Jun. 2011, 174 pages.
Altera, "External Memory Interface Handbook vol. 5 Section I. ALTMEMPHY Design Tutorials," Altera Corporation, Jun. 2011, 108 pages.
Altera, "DDR & DDR2 SDRAM Controller Compiler," Altera Corporation, Errata Sheet, Compiler Version 3.0.0, Oct. 2004, pp. 1-6.
Altera, "External Memory Interface Handbook vol. 4 Section III. Debugging," Altera Corporation, Dec. 2010, 110 pages.
Long, J., "Using Timing Designer with the Altera FPGA Design Flow," EMA TimingDesigner, Digital Timing, Oct. 30, 2008, 17 pages.
Altera, "External Memory PHY Interface (ALTMEMPHY) (nonAFI) Megafunction User Guide," Altera Corporation, Jan. 2010, 83 pages.
Altera, "DDR and DDR2 SDRAM Controller Compiler User Guide," Altera Corporation, Mar. 2009, 106 pages.
Altera, "DDR Timing Wizard User Guide," Altera Corporation, Nov. 2007, 92 pages.
Altera, "Utilizing Leveling Techniques in DDR3 SDRAM Memory Interfaces," Altera Corporation, White Paper, Version 1.0, Nov. 2007, pp. 1-7.
Non-Final Office Action from U.S. Appl. No. 15/996,365, dated Jul. 31, 2018.
Gopalan et al., U.S. Appl. No. 16/049,693, filed Jul. 30, 2018.
Plessas et al., "Advanced calibration techniques for high-speed source-synchronous interfaces," IIET Comput. Digit. Tech., 2011, vol. 5, Iss. 5, pp. 366-374.
Herrity, K., "DDR2 and DDR3 Deep Dive," Freescale Semiconductors, Nov. 2010, pp. 1-74.
DSD Applications, "Hardware and Layout Design Considerations for DDR Memory Interfaces," Freescale Semiconductor, Document No. AN2582, Apr. 2007, pp. 1-48.
Freescale Semiconductor, "PowerQUICC™ DDR2 SDRAM Controller Register Setting Considerations," Document No. AN3369, Sep. 2008, pp. 1-20.
Freescale Semiconductor, "PowerQUICC and QorIQ DDR3 SDRAM Controller Register Setting Considerations," Document No. AN4039, Nov. 2014, pp. 1-35.
Altera, "AN 438: Constraining and Analyzing Timing for External Memory Interfaces in Stratix IV, Stratix III, Arria II GX, and Cyclone III Devices," May 2009, pp. 1-50.
Lattice Semiconductor,"DDR Interface Design Implementation," A Lattice Semiconductor White Paper, Dec. 2004, pp. 1-25.
Moriyama et al., "DDR SDRAM Controller Using Virtex-5 FPGA Devices," Xilinx, XAPP851 (v1.1), Jul. 14, 2006, pp. 1-16.
Denali Software, Inc., "DDR PHY Interface (DFI) Specification," Denali Software, Inc., Version 2.1, Jan. 30, 2009, pp. 1-72.
Noorbasha, F., "FPGA Implementation of a 512Mb, 200MHz DDR SDRAM Data Controller," International Journal of Advances in Science and Technology, vol. 3, No. 1, 2011, pp. 1-6.
Avnet, "High Performance Clocking with the Xilinx® 7 Series," 2012 X Fest, pp. 1-83.
Cosoroaba, A., "Implementing high performance memory interfaces," Embedded Computing Design Annual Product Directory, Sep. 2005, pp. 1-4.
Shimpi, A.L., "IDF Fall 2006—Day 2: Geneseo, Santa Rosa, Memory Roadmap and More," ANANDTECH, Sep. 28, 2006, pp. 1-6.
JEDEC Standard, "DDR2 SDRAM Specification," JEDEC Standard No. 79-2F, Nov. 2009, pp. 1-128.
JEDEC Standard, "DDR3 SDRAM Specification," JEDEC Standard No. 79-3A, Sep. 2007, pp. 1-189.
JEDEC Standard, "DDR3 SDRAM Specification," JEDEC Standard No. 79-3E, Jul. 2010, pp. 1-226.
JEDEC Standard, "Double Data Rate (DDR) SDRAM," JESD79F, Feb. 2008, pp. 1-84.
JEDEC Standard, "Advanced Memory Buffer (AMB)," JEDEC Standard No. 82-20A, Mar. 2009, pp. 1-198.
Xilinx, "Libraries Guide," Xilinx Inc, 1995, pp. 1-757.
Xilinx, "Spartan-3 Generation FPGA User Guide," UG331 (v1.4) Jun. 25, 2008, pp. 1-520.
Xilinx, "Spartan-3E FPGA Family: Complete Data Sheet," DS312 Apr. 18, 2008, pp. 1-234.
Altera, "The Benefits of Altera's High-Speed DDR SDRAM Memory Interface Solution," May 2004, Ver. 1.1, pp. 1-16.
Micron Technology, Inc., "Technical Note High-Speed DRAM Controller Design," 2008, pp. 1-25.
Weil, J., "Board Design Best Practices," Freescale Semiconductor, Jun. 26, 2007, pp. 1-41.
True Circuits Inc., "DDR 4/3 PHY," 2015, pp. 1-2, as retrieved from www.truecircuits.com/ddr_phy.html.
Xilinx, "Programmable Logic Design: Quick Start Guide," UG500 (v1.0), May 8, 2008, pp. 1-126.
Xilinx, "Virtex-4 Family Overview," DS112 (v3.1) Aug. 30, 2010, pp. 1-9.
Altera, "Utilizing Leveling Techniques in DDR3 SDRAM Memory Interfaces," Nov. 2007, Ver. 1.0 1, pp. 1-7.
Cosoroaba, A., "Memory Interfaces Made Easy with Xilinx FPGAs and the Memory Interface Generator," Xilinx, WP260 (V1.0), Feb. 16, 2007, pp. 1-16.
Tran, J., "Synthesizable DDR SDRAM Controller," Xilinx, XAPP200 (v2.4), Jul. 18, 2002, pp. 1-16.
George, M., "Memory Interfaces Data Capture Using Direct Clocking Technique," Xilinx, XAPP701 (v1.1), Nov. 1, 2004, pp. 1-10.
George, M., "Memory Interfaces Data Capture Using Direct Clocking Technique," Xilinx, XAPP701 (v1.3), Sep. 13, 2005, pp. 1-11.
George, M., "Memory Interfaces Data Capture Using Direct Clocking Technique," Xilinx, XAPP701 (v1.4), Oct. 2, 2006, pp. 1-10.
Yeoh, T. Y., "DDR2 SDRAM Physical Layer Using Direct-Clocking Technique," Xilinx, XAPP701 (v2.0), Mar. 12, 2007, pp. 1-13.

(56) References Cited

OTHER PUBLICATIONS

Xilinx, "Xilinx Memory Interface Generator (MIG) User Guide: DDR SDRAM, DDRII SRAM, DDR2 SDRAM, QDRII SRAM, and RLDRAM II Interfaces," UG086 (v2.2), Mar. 3, 2008, pp. 1-446.

Gopalan, M. et al., U.S. Appl. No. 15/926,902, filed Mar. 20, 2018.

Notice of Allowance from U.S. Appl. No. 15/926,902, dated May 10, 2018.

Xilinx, "Memory Interface Solutions: User Guide," UG086 (v3.6), Sep. 21, 2010, pp. 1-598.

Xilinx, "Virtex-6 FPGA Memory Interface Solutions: User Guide," UG406, Mar. 1, 2011, pp. 1-316.

Xilinx, "Virtex-6 FPGA Memory Interface Solutions: User Guide," UG406, Jun. 22, 2011, pp. 1-340.

Xilinx, "7 Series FPGAs Memory Interface Solutions: User Guide," UG586, Mar. 1, 2011, pp. 1-164.

Altera, "Section I. Cyclone II Device Family Data Sheet," Altera Corporation, Feb. 2008, 169 pages.

Roge et al., "Calibration Techniques for High-Bandwidth Source-Synchronous Interfaces," DesignCon, Jan. 2007, pp. 1-16.

Altera, "ALTMEMPHY Megafunction, User Guide," Altera Corporation, Jun. 2007, 112 pages.

Altera, "Implementing Multiple Memory Interfaces Using the ALTMEMPHY Megafunction," Altera Corporation, May 2008, pp. 1-38.

Altera, "External Memory PHY Interface Megafunction User Guide (ALTMEMPHY)," Altera Corporation, Nov. 2008, 198 pages.

Altera, "Cyclone III FPGA Family," Altera Corporation, Powerpoint Presentation, 2009, 56 pages.

Altera, "Interfacing DDR SDRAM with Cyclone Devices," Altera Corporation, Version 1.1, Application Note 348, Jul. 2004, 42 pages.

Altera, "Interfacing DDR & DDR2 SDRAM with Cyclone II Devices," Altera Corporation, Version 1.3, Application Note 361, Jun. 2006, 42 pages.

Altera, "AN 550: Using the DLL Phase Offset Feature in Stratix FPGAs and HardCopy ASICs," Altera Corporation, Mar. 2010, 30 pages.

Non-Final Office Action from U.S. Appl. No. 16/049,693, dated Sep. 12, 2018.

Notice of Allowance from U.S. Appl. No. 15/996,365, dated Nov. 8, 2018.

* cited by examiner

METHOD FOR CALIBRATING CAPTURING READ DATA IN A READ DATA PATH FOR A DDR MEMORY INTERFACE CIRCUIT

PRIORITY CLAIM

This Application claims priority as a Continuation of U.S. patent application Ser. No. 15/249,188, filed on Aug. 26, 2016, currently pending, the contents of which are incorporated by reference.

U.S. patent application Ser. No. 15/249,188 claimed priority as a Continuation of U.S. patent application Ser. No. 14/882,226, filed on Oct. 13, 2015, registered as U.S. Pat. No. 9,431,091 on Aug. 30, 2016, the contents of which are incorporated by reference.

U.S. patent application Ser. No. 14/882,226, in turn claimed priority as a Nonprovisional Patent Application of U.S. Provisional Patent Application Ser. No. 62/063,136, filed on Oct. 13, 2014, entitled "Half-Frequency Dynamic Calibration for DDR Memory Controllers," by inventors Mahesh Gopalan, David Wu, and Venkat Iyer, commonly assigned with the present application and incorporated herein by reference.

U.S. patent application Ser. No. 14/882,226 also claimed priority as a Continuation-In-Part of U.S. Utility patent application Ser. No. 14/752,903, filed on Jun. 27, 2015, registered as U.S. Pat. No. 9,552,853 on Jan. 24, 2017, and entitled "Methods for Calibrating a Read Data Path for a Memory Interface," by inventors Jung Lee and Mahesh Gopalan, which in turn claims priority as a Continuation of U.S. Utility patent application Ser. No. 14/152,902, filed on Jan. 10, 2014, patented as U.S. Pat. No. 9,081,516 on Jul. 14, 2015 and entitled "Application Memory Preservation for Dynamic Calibration of Memory Interfaces," which in turn claimed priority as a Continuation of U.S. Utility patent application Ser. No. 14/023,630, filed on Sep. 11, 2013, patented as U.S. Pat. No. 8,843,778 on Sep. 23, 2014 and entitled "Dynamically Calibrated DDR Memory Controller," by inventors Jung Lee and Mahesh Gopalan, which in turn claimed priority as a Continuation of U.S. Utility patent application Ser. No. 13/172,740, filed Jun. 29, 2011, patented as U.S. Pat. No. 8,661,285 on Feb. 25, 2014 and entitled "Dynamically Calibrated DDR Memory Controller," by inventors Jung Lee and Mahesh Gopalan, which in turn claimed priority as a Continuation-In-Part of U.S. Utility patent application Ser. No. 12/157,081, filed on Jun. 6, 2008, patented as U.S. Pat. No. 7,975,164 on Jul. 5, 2011 and entitled "DDR Memory Controller" by inventors Jung Lee and Mahesh Gopalan, all commonly assigned with the present application and incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to circuits that interface with memories, in particular DDR or "double data rate" dynamic memories. Such circuits are found in a wide variety of integrated circuit devices including processors, ASICs, and ASSPs used in a wide variety of applications, as well as devices whose primary purpose is interfacing between memories and other devices.

BACKGROUND

Double Data Rate, or "DDR" memories are extremely popular due to their performance and density, however they present challenges to designers. In order to reduce the amount of real estate on the memory chips, much of the burden of controlling the devices has been offloaded to circuits known as DDR memory controllers. These controller circuits may reside on Processor, ASSP, or ASIC semiconductor devices, or alternately may reside on semiconductor devices dedicated solely to the purpose of controlling DDR memories. Given the high clock rates and fast edge speeds utilized in today's systems, timing considerations become challenging and it is often the case that timing skews vary greatly from one system implementation to another, especially for systems with larger amounts of memory and a greater overall width of the memory bus.

In general, the industry has responded by moving towards memory controllers that attempt to calibrate themselves during a power-on initialization sequence in order to adapt to a given system implementation. Such an approach has been supported by the DDR3 standard where a special register called a "Multi-Purpose Register" is included on the DDR3 memories in order for test data to be written prior to the calibration test performed during power-on initialization. The circuitry on memory controllers typically used for receiving data from DDR memories normally incorporates features into the Phy portion (Physical interface) of the memory controller circuit where the controller can adapt to system timing irregularities, this adaptation sometimes being calibrated during a power-on initialization test sequence.

FIG. 1 Shows a typical prior art DDR memory controller where an Asynchronous FIFO 101 is utilized to move data from the clocking domain of the Phy 102 to the Core clock domain 103. Incoming read data dq0 is clocked into input registers 105 and 106, each of these input registers being clocked on the opposite phase of a delayed version of the dqs clock 107, this delay having been performed by delay element 108.

Asynchronous FIFO 101 typically consists of at least eight stages of flip-flops requiring at least 16 flip-flops in total per dq data bit. Notice also that an additional circuit 109 for delay and gating of dqs has been added prior to driving the Write Clock input of FIFO 101. This is due to the potential that exists for glitches on dqs. Both data and control signals on a typical DDR memory bus are actually bidirectional. As such, dqs may float at times during the transition between writes and reads, and as such be susceptible to glitches during those time periods. For this reason, typical prior art in DDR controller designs utilizing asynchronous FIFOs add gating element 109 to reduce the propensity for errors due to glitches on dqs. After passing through the entire asynchronous FIFO 101, read data is transferred to the core domain according to Core_Clk 110. Additional circuitry is typically added to FIFO 101 in order to deal with timing issues relative to potential metastable conditions given the unpredictable relationship between Core_Clk and dqs.

FIG. 2 shows another prior art circuit for implementing a DDR memory controller, in particular a style utilized by the FPGA manufacturer Altera Corp. Portions of two byte lanes are shown in FIG. 2, the first byte lane represented by data bit dq0 201 and corresponding dqs strobe 202. The second byte lane is represented by dqs strobe 203 and data bit dq0 204. In general, the data and strobe signals connecting between a DDR memory and a DDR memory controller are organized such that each byte or eight bits of data has its own dqs strobe signal. Each of these groupings is referred to as a byte lane.

Looking at the data path starting with dq data bit 201 and dqs strobe 202, these pass through programmable delay elements 205 and 206 respectively before being stored in capture registers 207 and 208. Eventually these signals pass through a series of registers 209, 210, and 211 which are clocked by signals coming from tapped delay line 213. These registers form what is called a levelization FIFO and attempt to align the data bits within a byte lane relative to other byte lanes. Tapped delay line 213 is driven by a PLL re-synchronization clock generator 214 which also drives the final stage registers 212 of the levelization FIFO as well as being made available to the core circuitry of the controller. The PLL resynchronization clock generator 214 is phase and frequency synchronized with dqs. Notice that at this point, data stored in final stage registers 212 has not yet been captured by the core clock of the memory controller. Also notice that the circuit of FIG. 2 utilizes an individual delay element for each data bit such as dq0 201 and dq0 204.

When we examine fully-populated byte lanes, it should be noted that the additional delay elements required to provide an individual programmable delay on all incoming data bits can consume a large amount of silicon real estate on the device containing a DDR memory controller circuit. Such a situation is shown in FIG. 3 where a single dqs strobe 301 requires a single programmable delay 302, while the eight data bits 303 of the byte lane each drive a programmable delay element 304.

FIG. 4 describes some of the timing relationships that occur for a prior art DDR memory controller which uses delay elements within the Phy for individual read data bits. FIG. 4a shows a simplified diagram where a single data bit is programmably delayed by element 401 in addition to the dqs strobe being delayed by element 402. Typically data from input dq is captured on both the rising and falling edges of dqs as shown in FIGS. 1 and 2, however for the sake of simplicity, the diagrams of FIGS. 3-12 only show the schematic and timing for the dq bits captured on the rising edge of dqs. By controlling both of these two delays, the output of capture register 403 can be delayed by any amount within the range of the delay elements before it is passed into the core clock domain and clocked into register 404 by the Core_Clk signal 405. In FIG. 4b, the dqs_delayed signal 406 is placed near the center of the valid window for dq 407 and after being captured in register 403, data then enters the core domain at clock edge 408 is shown as shown. In this scenario the latency to move the data into the core domain is relatively low simply because of the natural relationship between core clock and dqs. This relationship however is extremely dependent upon the system topology and delays, and in fact could have almost any phase relationship.

A different phase relationship is possible as shown in FIG. 4c. Here, a first edge 409 of Core_Clk happens to occur just before the leading edge 410 of dqs_delayed. The result is that each data bit will not be captured in the core clock domain until leading edge 411 of Core_Clk as shown, and thus will be delayed by amount of time 412 before being transferred into the core domain. Thus, while the ability to delay both dq and dqs can accomplish synchronization with the core clock, it may introduce a significant amount of latency in the process.

A DDR memory controller circuit and method is therefore needed that reliably captures and processes memory data during read cycles while requiring a small gate count resulting in implementations requiring a small amount of silicon real estate. The controller should also offer a high yield for memory controller devices as well as a high yield for memory system implementations using those controller devices. Further, it is desirable to provide a DDR memory controller that is calibrated to compensate for system level timing irregularities and for chip process parameter variations—that calibration occurring not only during power-up initialization, but also dynamically during system operation to further compensate for power supply voltage variations over time as well as system level timing variations as the system warms during operation.

Further it is useful to have a memory controller circuit that can perform a portion of calibration operations while allowing a signal gating window that is large, and then can perform further calibration operations and functional operation with an optimized signal gating window.

Also, given the ever increasing clock rates that memories are capable of, it is useful to perform calibration and functional operation with some number of related signals within a memory controller operating at half the frequency of memory strobe signals such as DQS.

SUMMARY

One object of this invention is to provide a DDR memory controller with a more flexible timing calibration capability such that the controller may be calibrated for higher performance operation while at the same time providing more margin for system timing variations.

Another object of this invention is to provide a DDR memory controller with a more flexible timing calibration capability where this timing calibration is operated during the power-up initialization of the device containing the DDR memory controller and, where this timing calibration is performed in conjunction with at least one DDR memory device, both said device and controller installed in a system environment, and where the timing calibration performed by the memory controller takes into account delays in the round-trip path between the DDR memory controller and the DDR memory. By taking into account system delays during this calibration, the overall yield of the system is improved, and effectively the yield of the devices containing the DDR memory controller is also improved since the DDR memory controller is therefore self-adaptive to the irregularities of the system environment.

Another object of this invention is to provide a DDR memory controller that transfers, at an earlier point in time, captured data on memory read cycles from the dqs clock domain to the core clock domain. This reduces the possibility that a glitch on dqs that may occur during the time period where dqs is not driven, would inadvertently clock invalid data into the controller during read cycles.

Another object of this invention is to provide a DDR Memory Controller with a smaller gate count thereby reducing the amount of silicon required to implement the controller and the size and cost of the semiconductor device containing the controller function. Gate count is reduced by eliminating delay elements on the dq data inputs, and by eliminating the use of an asynchronous FIFO for transitioning data from the dqs clock domain to the core clock domain.

Another object of this invention is to move captured data into the core clock domain as quickly as possible for read cycles to minimize latency.

Another object of this invention is to provide a DDR memory controller that is calibrated to compensate for system level timing irregularities and for chip process parameter variations where that calibration occurs dynamically during system operation to compensate for power supply voltage variations over time as well as system level timing variations as the system warms during operation.

Another object of the invention is to provide a memory interface that includes two different windows for gating key timing signals like DQS—a first that is large and allows for performing initial calibration functions when the precise timing is not yet known, and a second for gating key timing signals more precisely as timing relationships become more defined as the calibration process progresses.

Another object of the invention is to provide a memory interface that operates at substantially half a DQS clock rate, or a reduced clock rate, such that data can be captured accurately and calibration performed accurately even as primary clock rates for memories increase over successive technology generations.

Also shown in FIGS. 19-22 are circuit details and timing relationships for a memory interface that operates at substantially half a DQS clock rate, or a reduced clock rate, such that data can be captured accurately and calibration performed accurately even as primary clock rates for memories increase over successive technology generations.

FIGS. 23-26 depict additional details of the half frequency operation, pursuant to one embodiment of the invention.

DETAILED DESCRIPTION OF THE INVENTION

In contrast to prior art DDR memory controllers where calibration features for timing inconsistencies are implemented only in the Phy portion of the controller, the DDR memory controller of one embodiment of the present invention focuses on utilizing core domain clocking mechanisms, at times combined with circuitry in the Phy, to implement an improved solution for a timing-adaptive DDR memory controller.

Figure 4:
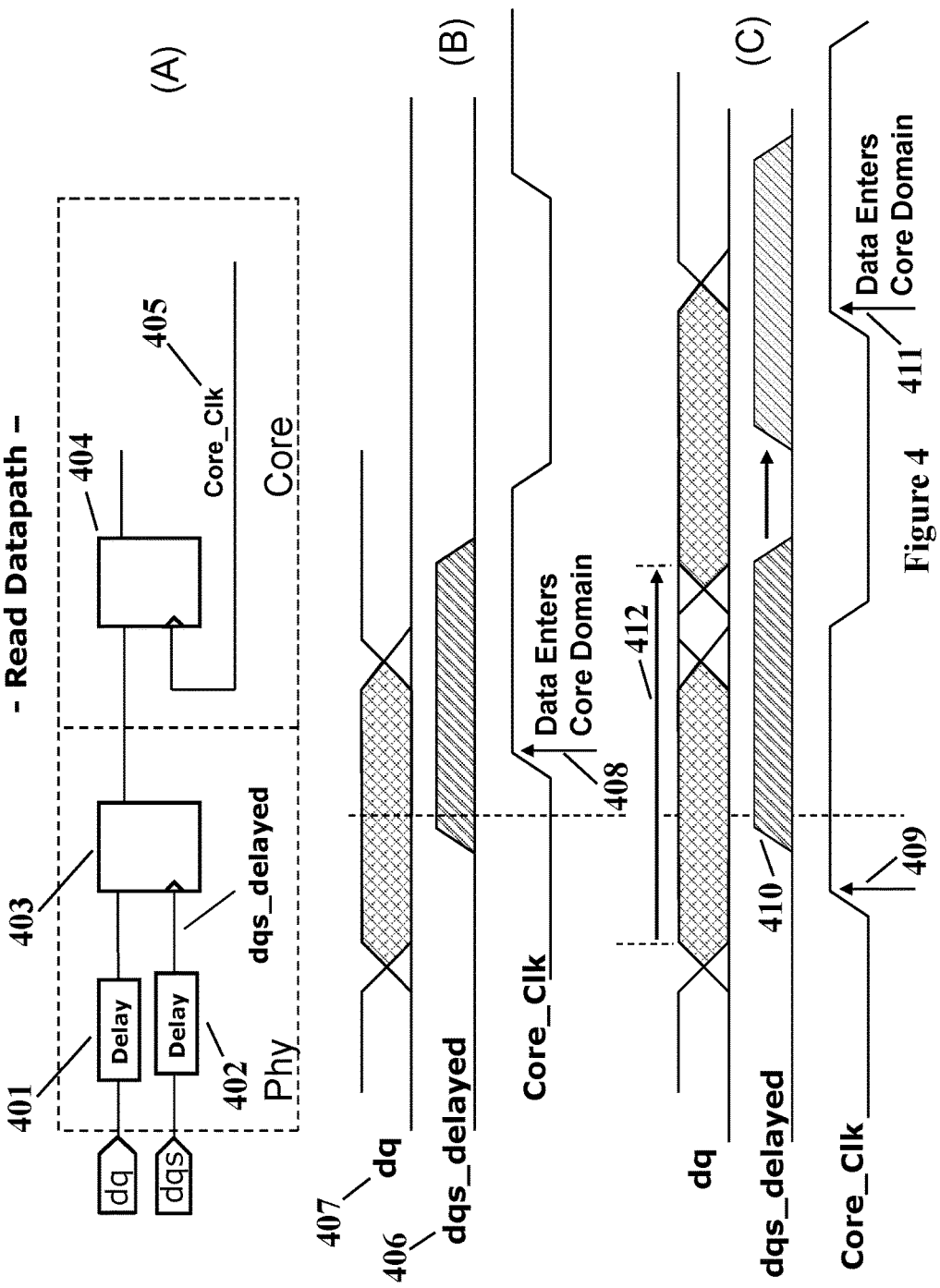
FIG. 4 shows the data capture and synchronization timing for the read data path of a prior art DDR memory controller having delay elements on both dq and dqs inputs.
Figure 5:
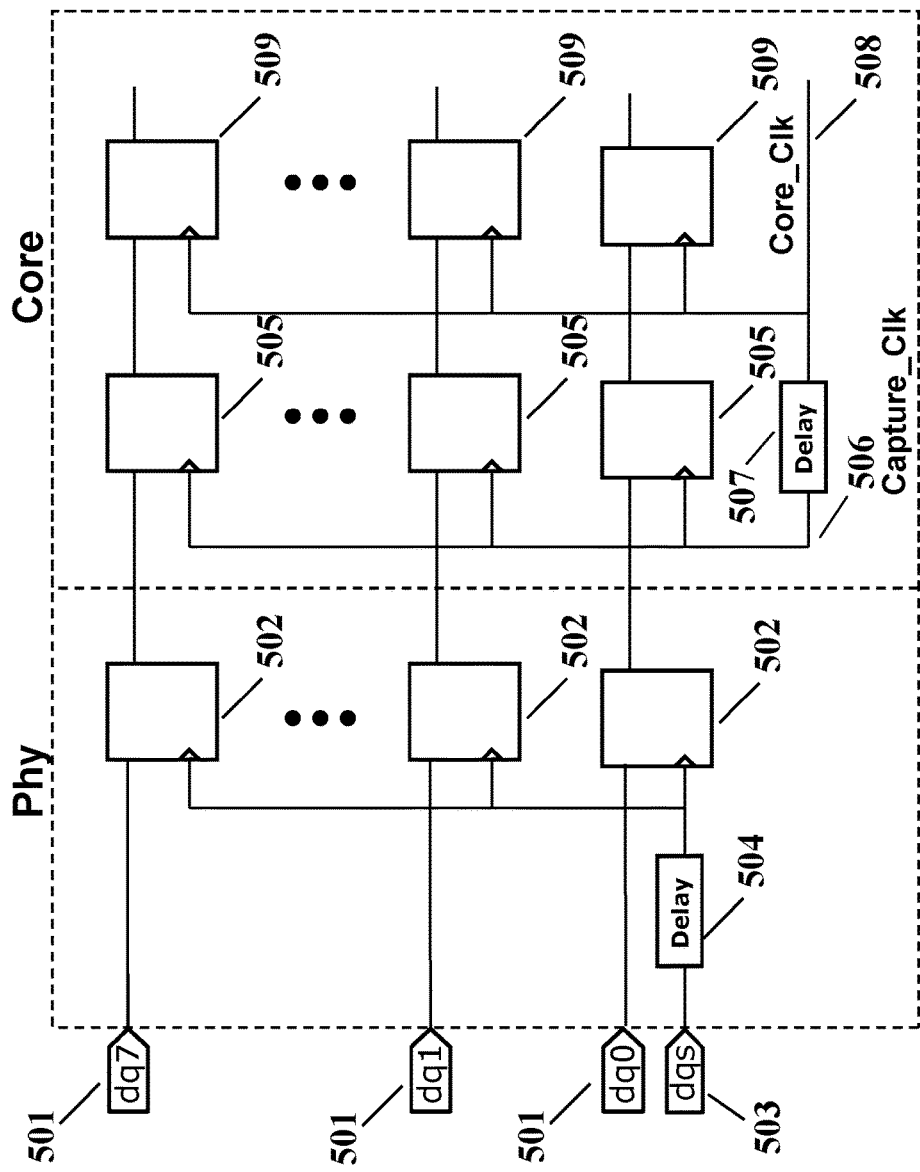
FIG. 5 shows the read data path for a DDR memory controller according to an embodiment of the present invention where delay elements are used on dqs but not on dq inputs, and read data synchronization is performed with the core clock by way of a core clock delay element.

In contrast with the prior art circuit of FIG. 4, FIG. 5 shows a simplified version of a DDR controller circuit according to an embodiment of the present invention. Here, the data inputs for a byte lane 501 are shown being captured in dq read data registers 502 without any additional delay elements added, these registers being clocked by a delayed version of dqs. The dqs clock signal 503 has dqs delay element 504 added, typically delaying dqs by approximately 90 degrees relative to the dqs signal driven by the DDR memory. The outputs of registers 502 enter the core domain and are captured in first core domain registers 505. Registers 505 are clocked by a delayed version of Core_Clk called Capture_Clk 506. Capture_Clk is essentially the output of core clock delay element 507 which produces a programmably delayed version of Core_Clk 508. The outputs of first core domain registers 505 feed second core domain registers 509 which are clocked by Core_Clk. The amount of delay assigned to programmable delay element 507 is controlled by a self-configuring logic circuit (SCL) contained within the memory controller, this self-configuring logic circuit determining the appropriate delay for element 507 during a power-on initialization test and calibration operation.

Figure 6:
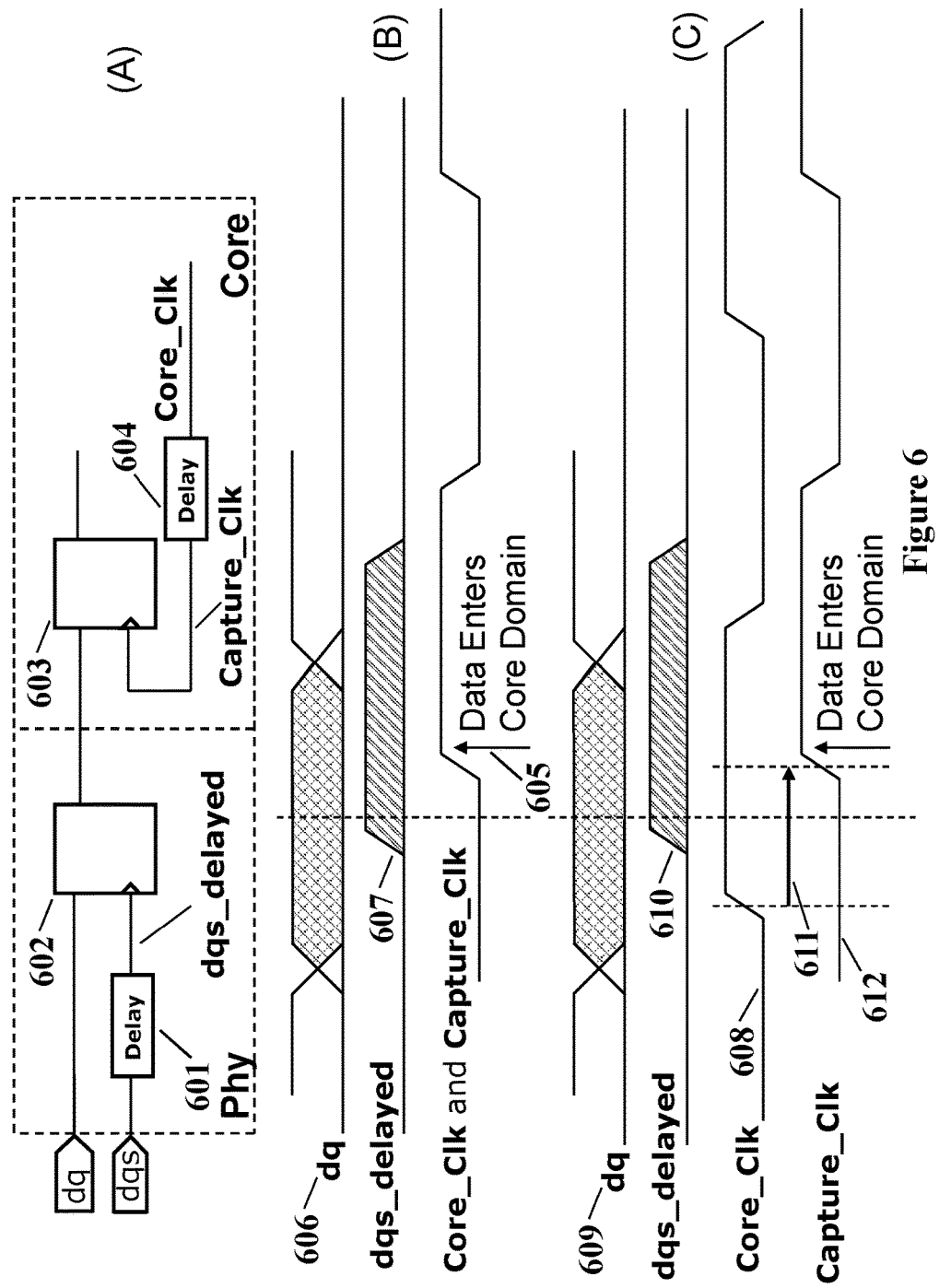
FIG. 6 shows the data capture and synchronization timing for the read data path of a DDR memory controller according to an embodiment of the present invention where delay elements are used on dqs but not on dq inputs, and read data synchronization is performed with the core clock by way of a core clock delay element.

FIG. 6 shows how the timing for the read data path can occur for the DDR memory controller circuit of one embodiment of the present invention. A simplified version of the read data path is shown in FIG. 6a where dqs is delayed by dqs delay element 601 which clocks dq into Phy data capture register 602. The output of data capture register 602 then feeds the first core domain register 603 which is clocked by Capture_Clk, the output of core clock delay element 604. The timing scenario shown in FIG. 6 occurs when the active edge of Core_Clk 605 (depicted in FIG. 6(b)) occurs just after dq data 606 has been clocked into Phy data capture register 602 by dqs_delayed 607. In this scenario, data can be immediately clocked into first core domain register 603, and thus delay element 604 may be programmably set to a delay of essentially zero, making the timing for Capture_Clk essentially the same as Core_Clk.

FIG. 6(c) a shows another timing scenario where the active edge of Core_Clk 608 occurs just prior to dq data 609 being clocked into Phy data capture register 602 by dqs_delayed 610. As a result, core clock delay element 604 will be programmed with delay 611 such that first core domain register 603 is clocked on the active edge of Capture_Clk 612. Thus, regardless of the natural timing of Core_Clk relative to dqs, Capture_Clk will be positioned such that data will move from the Phy domain to the core domain in a predictable manner with minimal added latency due to random clock alignment.

Figure 7:
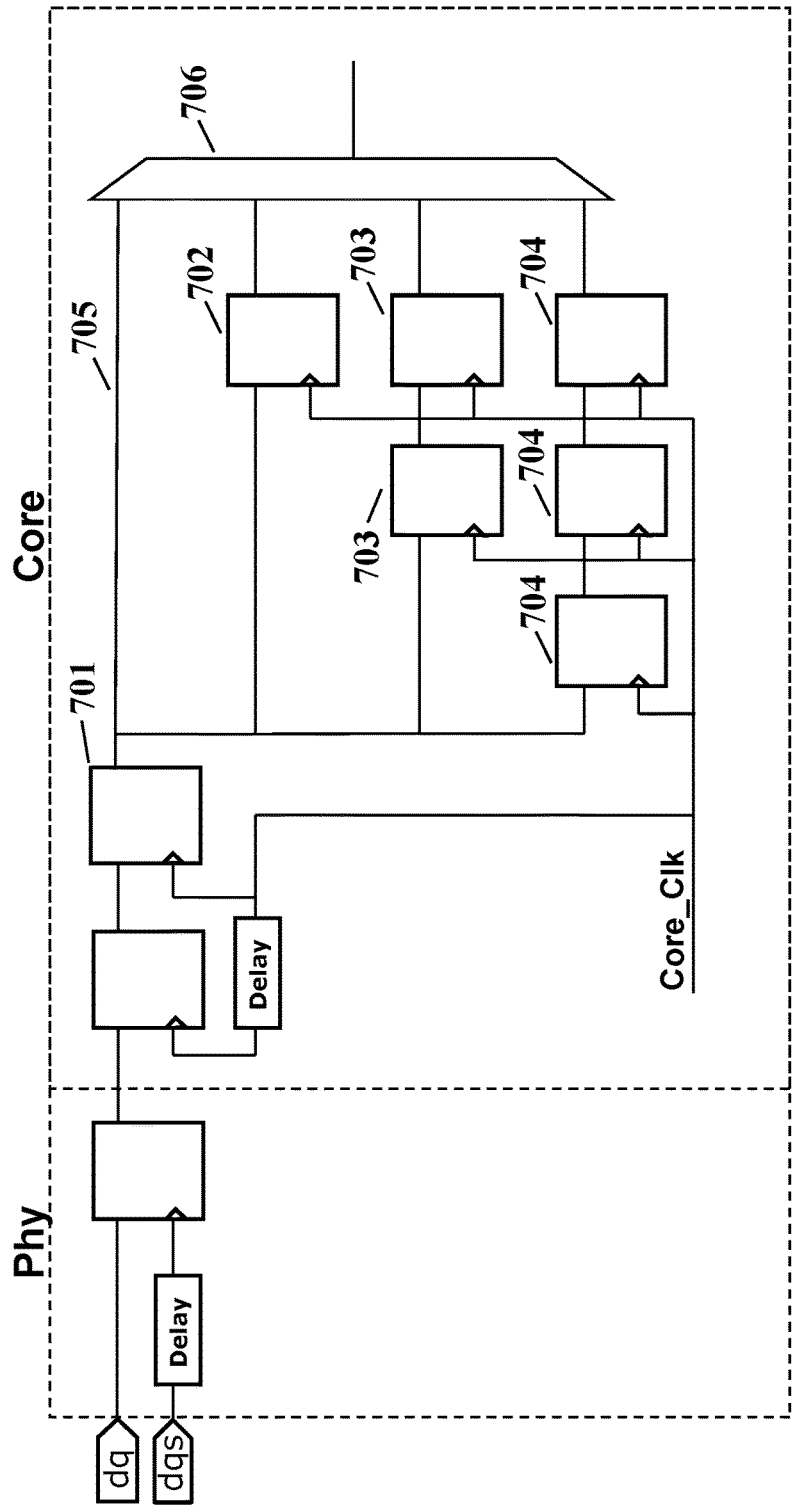
FIG. 7 shows the read data path for a DDR memory controller according to one embodiment of the present invention including a CAS latency compensation circuit which is clocked by the core clock.

FIG. 7 shows an embodiment for the present invention including a circuit that compensates for CAS latency. According to Wikipedia: "CAS latency (CL) is the time (in number of clock cycles) that elapses between the memory controller telling the memory module to access a particular column in the current row, and the data from that column being read from the module's output pins. Data is stored in individual memory cells, each uniquely identified by a memory bank, row, and column. To access DRAM, controllers first select a memory bank, then a row (using the row address strobe, RAS), then a column (using the CAS), and finally request to read the data from the physical location of the memory cell. The CAS latency is the number of clock cycles that elapse from the time the request for data is sent to the actual memory location until the data is transmitted from the module." Thus, there is a timing unpredictability in any system implementation involving DDR memory between the read request from the controller to the memory and the resulting data actually arriving back at the memory controller. The amount of this timing unpredictability can be determined during the power-on initialization test and calibration operation, and then compensated for by the circuit shown in FIG. 7 where the output of second core domain register 701 feeds a partially populated array of registers 702, 703, and 704, which along with direct connection path 705 feed multiplexer 706. These registers are all clocked by Core_Clk and thus create different numbers of clock cycles of CAS latency compensation depending upon which input is selected for multiplexer 706. During the power-on initialization test and calibration operation, different inputs for multiplexer 706 will be selected at different times during the test in order to determine which of the paths leading to multiplexer 706 is appropriate in order to properly compensate for the CAS delay in a particular system installation.

Figure 1:
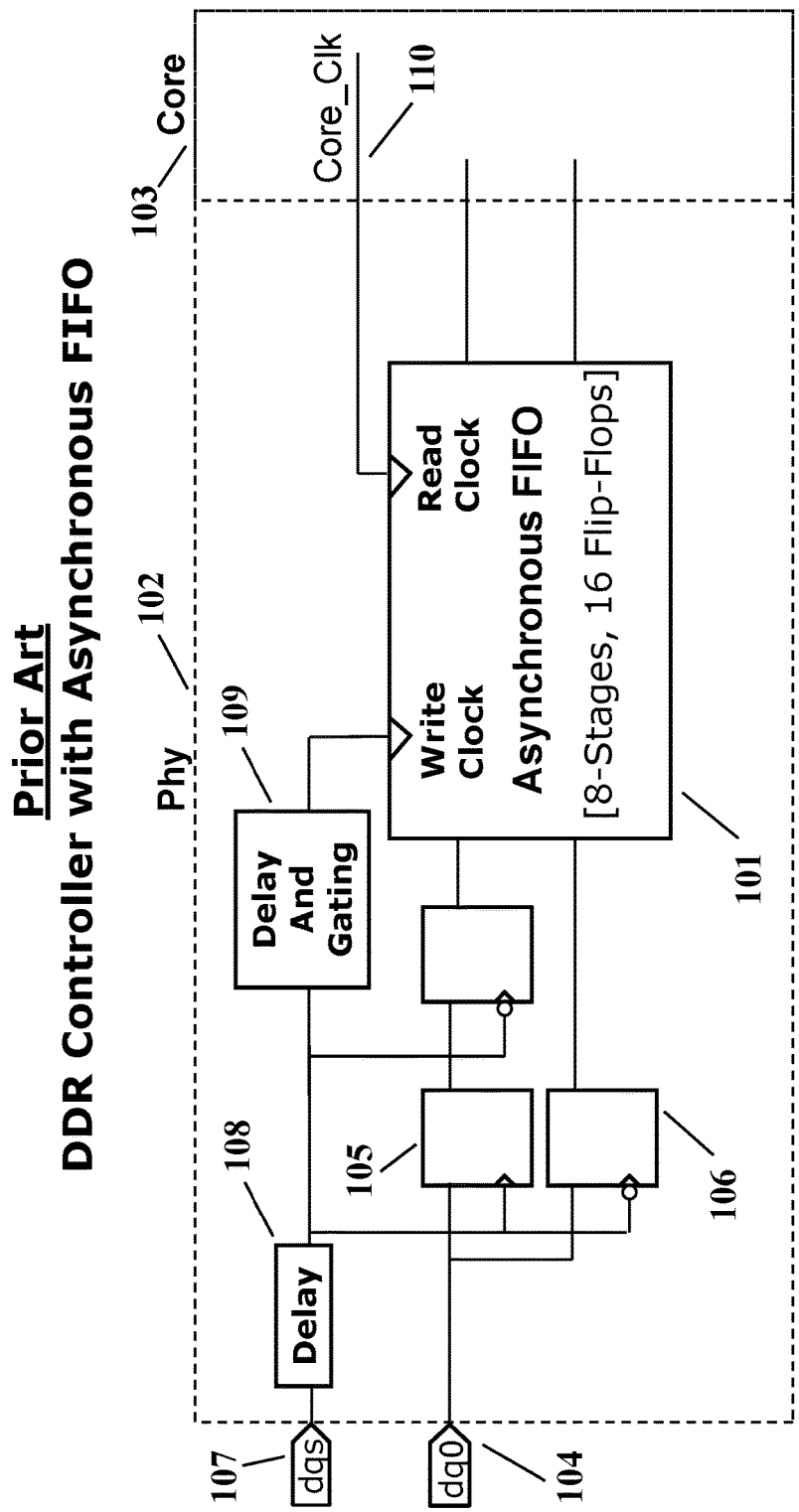
FIG. 1 shows a prior art DDR memory controller which utilizes an asynchronous FIFO with gated clock, all contained within the Phy portion of the controller circuit.
Figure 8:
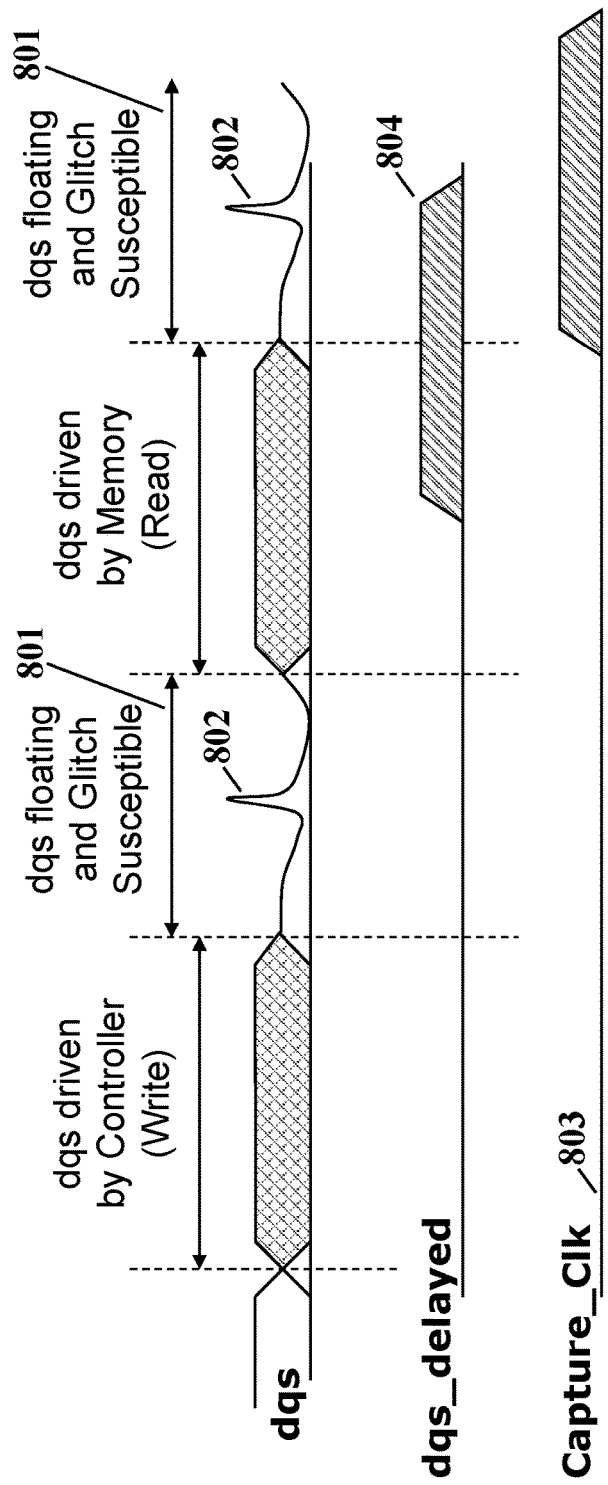
FIG. 8 shows the glitch problem which can occur on the bidirectional dqs signal in DDR memory systems.

In the earlier discussion with reference to FIG. 1, it was mentioned that delay and gating element 109 was included in order to lower the propensity for spurious glitches on dqs inadvertently clocking FIFO 101. The timing diagram of FIG. 8 shows this problem in more detail. During the normal sequence of operation of a DDR memory, the dqs strobe is first driven by the memory controller during a write cycle and then, during a read cycle it is driven by the DDR memory. In between, the there is a transitional time period 801 where the dqs connection may float, that is not be driven by either the memory or the controller. During time periods 801, it is possible for glitches 802 to be induced in dqs from a variety of sources including cross coupling from edges on other signals on boards or in the IC packages for the memory and/or the controller. In order to minimize the chance of any glitch on dqs causing data corruption, the embodiment of the present invention as shown in FIGS. 5 through 7 allows capture clock 803 to be optimally positioned relative to dqs_delayed 804 such that read data is always moved into the core clock domain as early as possible.

Figure 2:
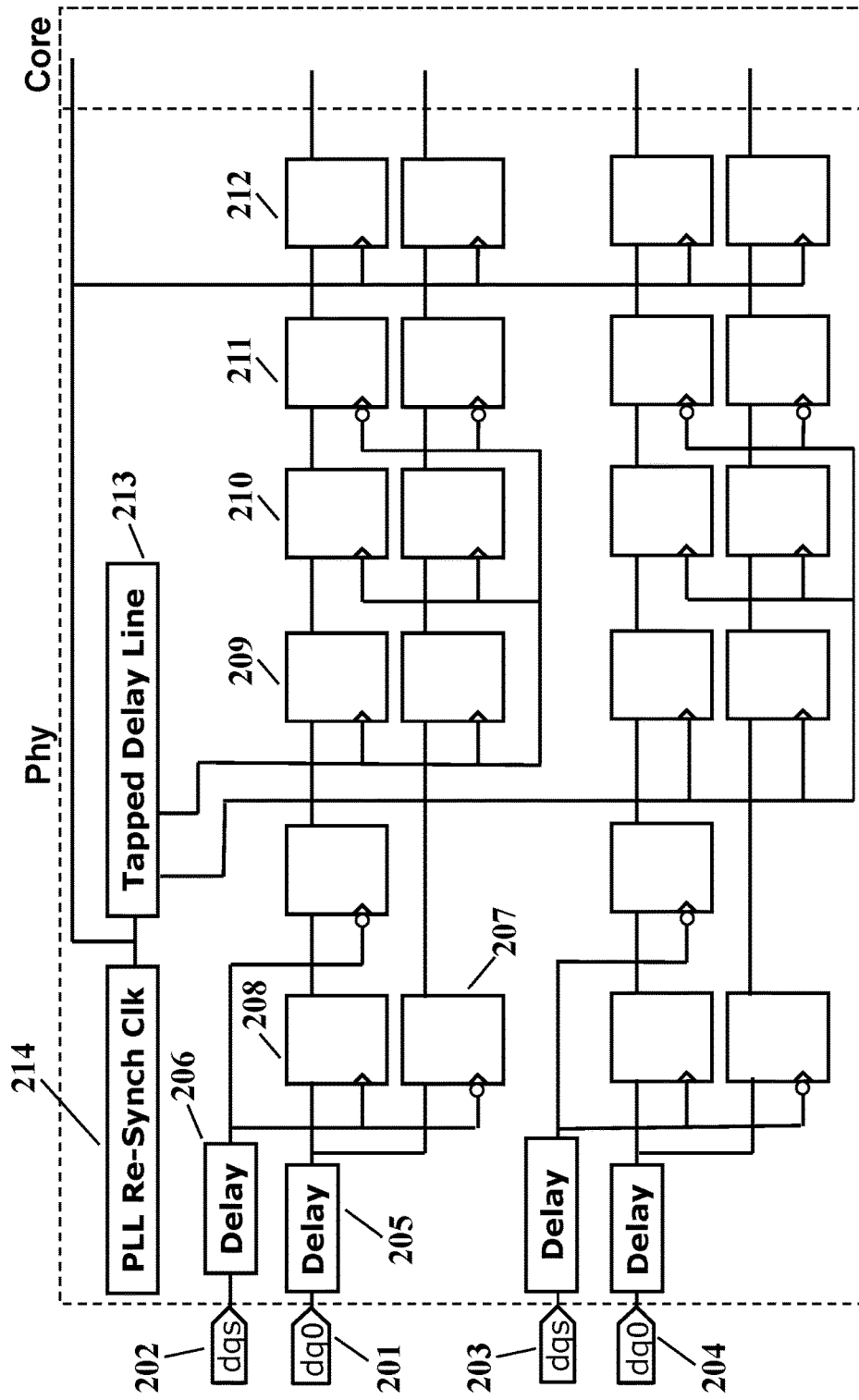
FIG. 2 shows a prior art DDR memory controller where delay elements are used on both dq and dqs signals and a form of FIFO is used for data levelization, the FIFO being clocked by a clock that is PLL-synchronized with dqs, the entire circuit contained within the Phy portion of the memory controller.
Figure 3:
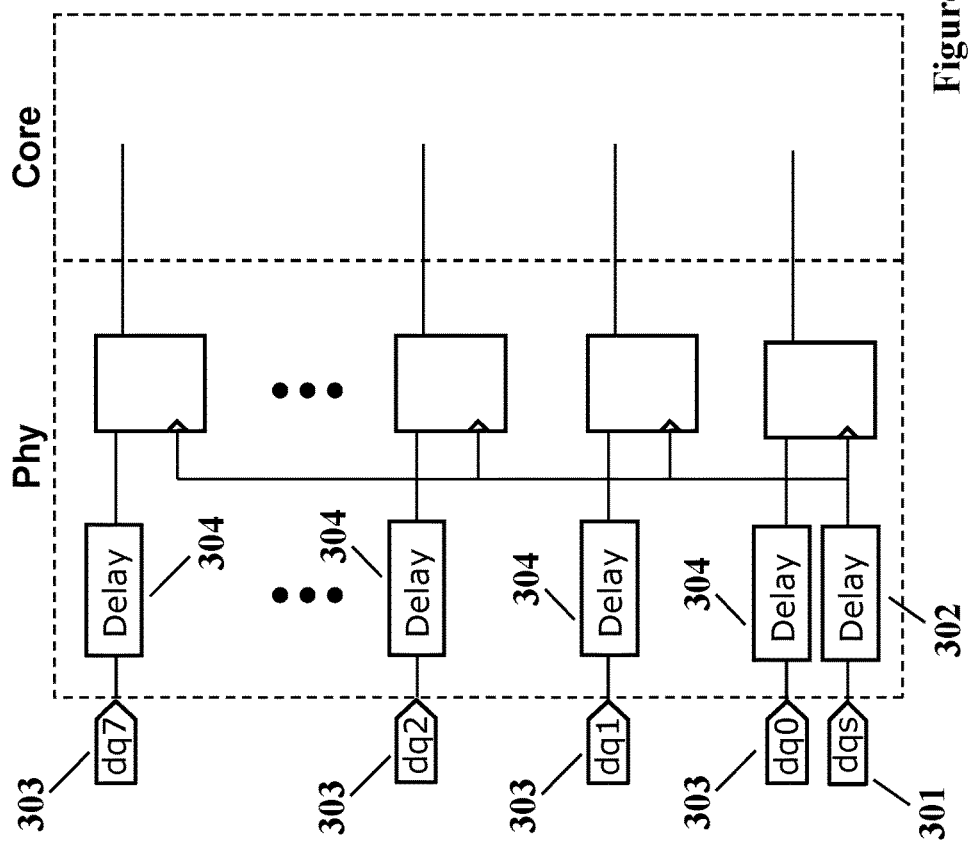
FIG. 3 describes the read data path for a prior art DDR memory controller having delay elements on both dq and dqs inputs.
Figure 9:
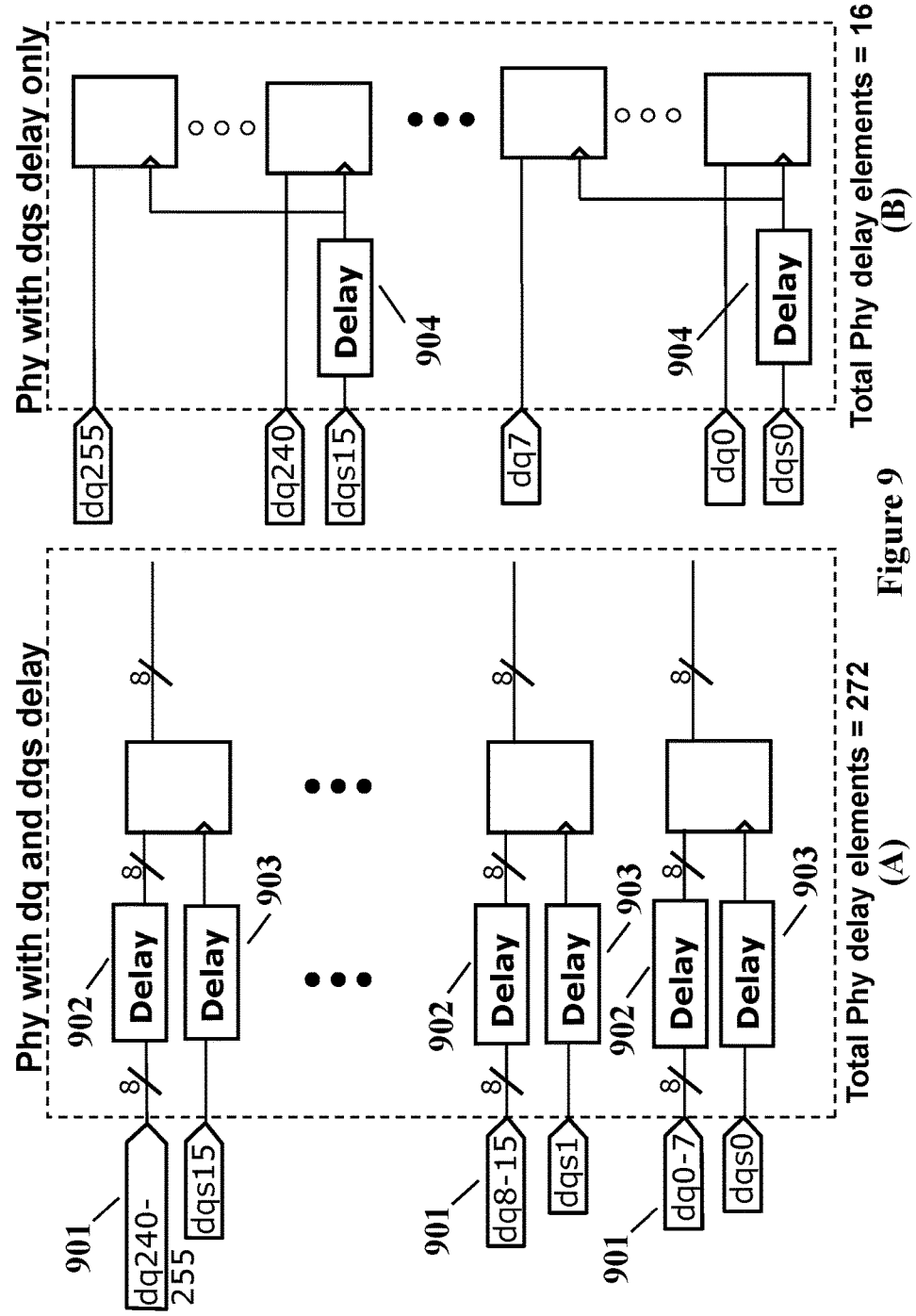
FIG. 9 shows a comparison of prior art memory controllers which utilize delay elements on both dq and the dqs inputs when compared with the memory controller of one embodiment of the present invention, with emphasis on the number of total delay elements required for each implementation.

FIG. 9 shows a comparison between an embodiment the present invention and prior art memory controllers according to FIGS. 2 through 4, with emphasis on the amount of silicon real estate required based on the numbers of delay elements introduced for an example implementation containing a total of 256 data bits. Notice in FIG. 9a that prior art memory controllers that include delay elements on all dq data bits 901 would require 256 delay elements 902 for dq inputs in addition to 16 delay elements 903 for dqs inputs. In contrast to this, FIG. 9b shows an implementation according to one embodiment of the present invention where only dqs input delay elements 904 are required and therefore the total number of delay elements in the Phy for an embodiment the present invention is 16 versus 272 for the prior art implementation of FIG. 9a.

Figure 10:
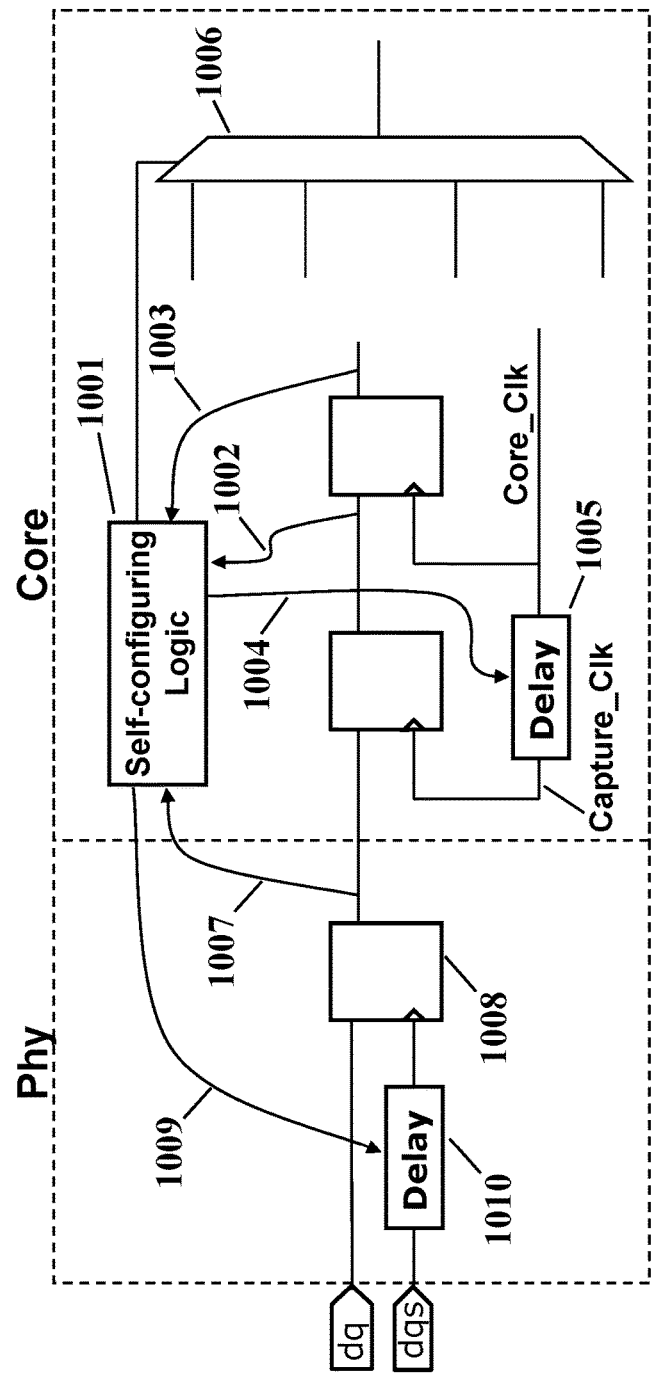
FIG. 10 shows a diagram for the read data path of a DDR memory controller according to one embodiment of the present invention with emphasis on the inputs and outputs for the Self Configuring Logic function which controls the programmable delay elements.

FIG. 10 shows a diagram of how the Self Configuring Logic (SCL) function 1001 interfaces with other elements of the DDR memory controller according to an embodiment of the present invention. In a first embodiment of the present invention, the SCL 1001 receives the output 1002 of the first core domain register (clocked by Capture_Clk) as well as the output 1003 of the second core domain register (clocked by Core_Clk). In turn, the SCL provides output 1004 which controls the delay of the delay element 1005 which creates Capture_Clk. The SCL also drives multiplexer 1006 which selects the different paths which implement the CAS latency compensation circuit as previously described in FIG. 7 where multiplexer 706 performs this selection function.

In an alternate embodiment of the present invention, SCL 1001 also receives data 1007 from input data register 1008, and in turn also controls 1009 dqs delay element 1010, thereby enabling a much finer degree of control for the dqs delay function than is normally utilized in most memory controller designs, as well as allowing the dqs delay to be initialized as part of the power on initialization test and calibration operation.

Figure 11:
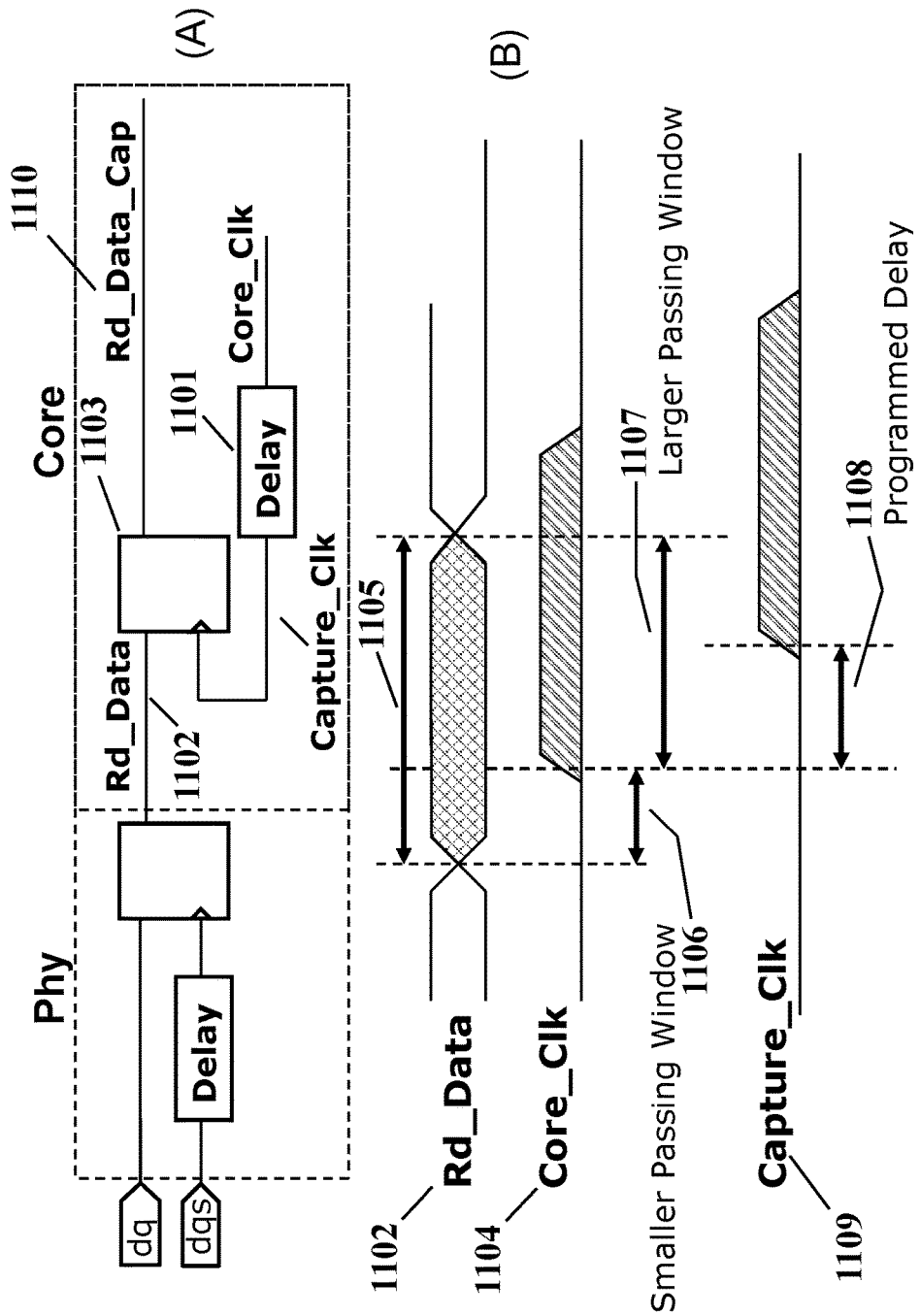
FIG. 11 describes the timing relationships involved in choosing the larger passing window when the delay element producing Capture_Clk is to be programmed according to one embodiment of the present invention.

FIG. 11 describes the concept behind the process for choosing the larger passing window when positioning Capture_Clk. As described previously for an embodiment the present invention, the core clock signal is delayed in element 1101 as shown in FIG. 11a to produce Capture_Clk. FIG. 11b shows a timing diagram where the RD_Data signal 1102 is to be captured in first core domain register 1103. As shown in FIG. 11b, the position of core clock 1104 rarely falls in the center of the time that RD_Data 1102 is valid, in this instance being position towards the beginning of the valid time period 1105 for RD_Data. In this instance, two passing windows 1106 and 1107 have been created, with 1106 being the smaller passing window and 1107 being the larger passing window.

Therefore in the scenario shown in FIG. 11b, some amount of programmed delay 1108 would be programmed into delay element 1101 in order that Capture_Clk 1109 may be positioned in the larger passing window 1107.

Figure 12:
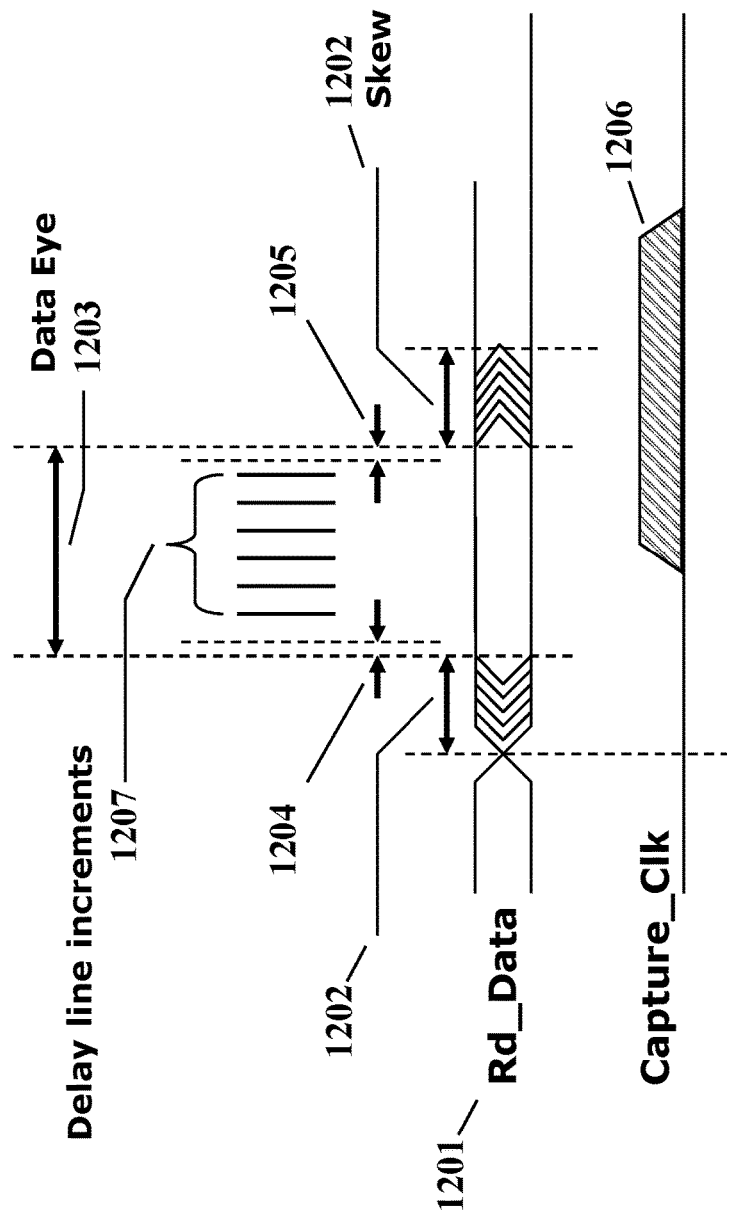
FIG. 12 shows a timing diagram for the data eye indicating the common window for valid data across a group of data bits such as a byte lane, given the skew that exists between all the data bits.

FIG. 12 shows a timing diagram for a group of data bits in a byte lane such as Rd_Data 1201 where the timing skew 1202 across the group of bits is shown as indicated. The common time across all data bits in the group where data is simultaneously valid is called the data eye 1203. After subtracting setup time 1204 and hold time 1205 from data eye 1203, what remains is the window within which Capture_Clk 1206 may be placed in order to properly clock valid data on all bits of Rd_Data 1201 within the byte lane. Delay line increments 1207 represent the possible timing positions that may be chosen for a programmable delay line to implement core clock delay element 604 that produces Capture_Clk. For all systems there will be a minimum number of delay line increments 1207 for which the power on initialization test will determine that data is captured successfully, achieving that minimum number being necessary for the manufacturer of the system to feel confident that the timing margin is robust enough for a production unit to be declared good. Thus, this number of delay line increments that is seen as a minimum requirement for a successful test is specified and stored in the system containing the memory controller, and is utilized in determining if the power-on initialization and calibration test is successful.

Figure 13:
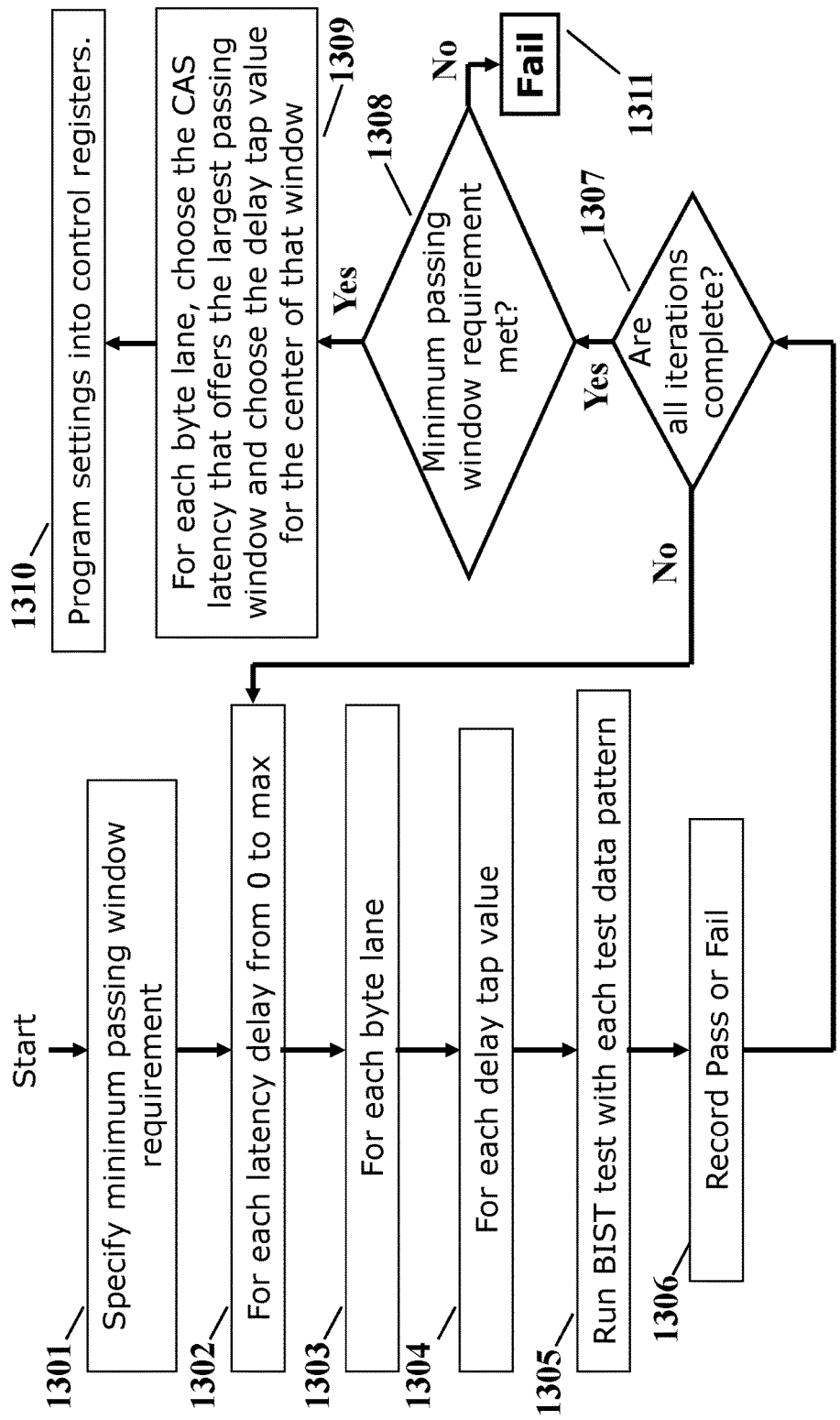
FIG. 13 shows a flow chart for the power-on initialization test and calibration operation according to one embodiment of the present invention, the results of this operation including choosing programmable delay values.

FIG. 13 shows a flow chart for the process implemented according to one embodiment of the present invention for a power-on initialization test and calibration operation. Software or firmware controls this operation and typically runs on a processor located in the system containing the DDR memory and the controller functionality described herein. This processor may be located on the IC containing the memory controller functionality, or may be located elsewhere within the system. In step 1301, a minimum passing window requirement is specified in terms of a minimum number of delay increments for which data is successfully captured, as described in the diagram of FIG. 12. The minimum passing window requirement will be used to determine a pass or fail condition during the test, and also may be used in order to determine the number of delay increments that must be tested and how many iterations of the test loops (steps 1302 through 1307) must be performed. Steps 1302, 1303, 1304, 1305, and 1306 together implement what in general is known as nested "for" loops. Thus, for each latency delay value to be tested according to step 1302, each byte lane will be tested according to step 1303. And, for each byte lane to be tested according to step 1303, each delay tap value within a chosen range of delay tap values will be tested according to step 1304. So, for each specific permutation of latency delay, byte lane, and delay tap value, the BIST test (Built-In Self-Test for the read data test) will be run according to step 1305, and a pass or fail result will be recorded according to step 1306. Once all iterations of the nested "for" loops are completed as determined by step 1307, the processor controlling the power-on initialization and calibration test will then check (step 1308) to see if the minimum passing window requirement has been met as specified in step 1301. If the minimum has not been met, then the system will indicate a failure 1311. If the requirement has been met, then according to step 1309 for each byte lane the processor will choose the latency value that offers the largest passing window, and then choose the delay tap value the places capture clock in the center of that window. Finally, values will be programmed into control registers according to step 1310 such that all delays within the controller system according to this invention are programmed with optimum settings.

Further, it is desirable to provide a DDR memory controller that is calibrated to compensate for system level timing irregularities and for chip process parameter variations—that calibration occurring not only during power-up initialization, but also dynamically during system operation to further compensate for power supply voltage variations over time as well as system level timing variations as the system environment variables (such as temperature) change during operation. DSCL, a dynamic version of the SCL or Self Configuring Logic functionality as described herein, addresses the problem of VT (voltage and temperature) variations during normal operation of a chip that utilizes a DDR memory controller as described herein to access a DRAM. Regular SCL as described earlier is typically run only on system power on. It can calibrate for the system level timing at the time it is run and can compensate for PVT (Process variations in addition to Voltage and Temperature) variations that occur from chip to chip, and do it in the context of the system operation.

Computer memory is vulnerable to temperature changes both in the controller and the corresponding memory modules. As any DDR memory chip or as the chip containing the DDR memory controller heat up, and supply voltage variations occur due to other external factors such as loading experienced by the power supply source, VT variations can cause system level timing to change. These changes can affect the optimal programming settings as compared with those that were produced by operation of the SCL function when calibration was run at power on. Thus, DSCL functionality helps the chip to continuously compensate for VT variations providing the best DRAM timing margin even as system timing changes significantly over time. By performing the necessary calibration in the shortest period of time, DSCL also ensures that the impact on system performance is minimal. DSCL divides the problem of calculating the Capture_Clk delay and the problem of CAS latency compensation into separate problems per FIGS. 16 and 18, and solves each of these problems independently. It also runs independently and parallely in each byte lane. Thus the whole calibration process is greatly speeded up. Specifically, in one embodiment, if the user has an on-board CPU, the non-dynamic SCL could be run within about 2 milliseconds assuming 4 byte lanes and 4 milliseconds for 8 byte lanes. In one embodiment of the dynamic SCL, regardless of 4 or 8 byte lanes, SCL would run within 1 micro-second.

The operation of the DSCL functionality described herein utilizes portions of the existing SCL circuitry previously described and utilizes that existing circuitry during both the calibration phase and operational phase, however new circuitry is added for DSCL and the calibration phase is broken into two sub-phases. One of these sub-phases corresponds to the process described in FIG. 16, and the other sub-phase corresponds to the process described in FIG. 18.

Figure 14:
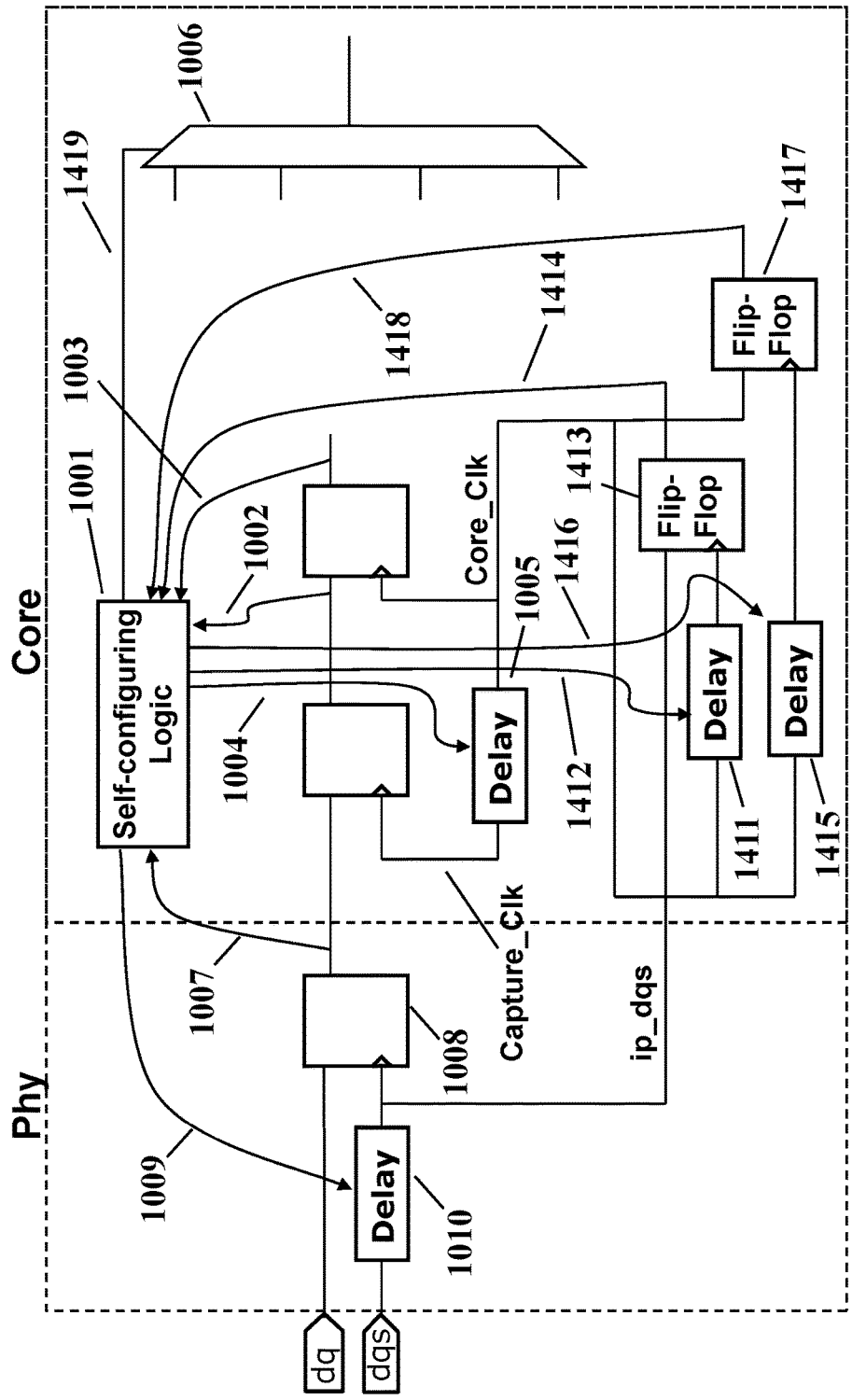
FIG. 14 shows the functionality of FIG. 10 with circuitry added to implement a dynamically calibrated DDR controller function according to one embodiment of the invention, in particular to determine an optimum Capture_Clk delay.

FIG. 14, when compared with FIG. 10, shows the circuit component additions which may be present in order to support the dynamically calibrated version of the DDR memory controller as described herein. The purpose of the additions to FIG. 10 as shown in FIG. 14 is to support the first phase of the SCL calibration whereby an optimum Capture_Clk delay is determined according to the process of FIG. 16. The optimum Capture_Clk value is determined by the Self-configuring Logic 1001 output 1004 to the Delay element 1005. Here, the delayed version of the dqs input signal produced by delay element 1010 and herein called ip_dqs is sampled in flip-flop 1413. Flip-flop 1413 is clocked by the output of delay element 1411 which delays Core_Clk. The output of flip-flop 1413 is connected 1414 to the self configuring logic function 1001. Core_Clk is also delayed in delay element 1415 which in turn samples Core_Clk in flip-flop 1417. The output of flip-flop 1417 is connected 1418 to the self configuring logic function 1001. Delay elements 1411 and 1415 are controlled respectively by signals 1412 and 1416 from self configuring logic function 1001. An output 1419 of SCL logic function 1001 controls the select lines of multiplexer 1006 which is the same multiplexer as shown earlier as multiplexer 706 in FIG. 7 and is used to select captured read data which is delayed by different increments according to which flip-flop delay chain path is most appropriate.

Figure 15:
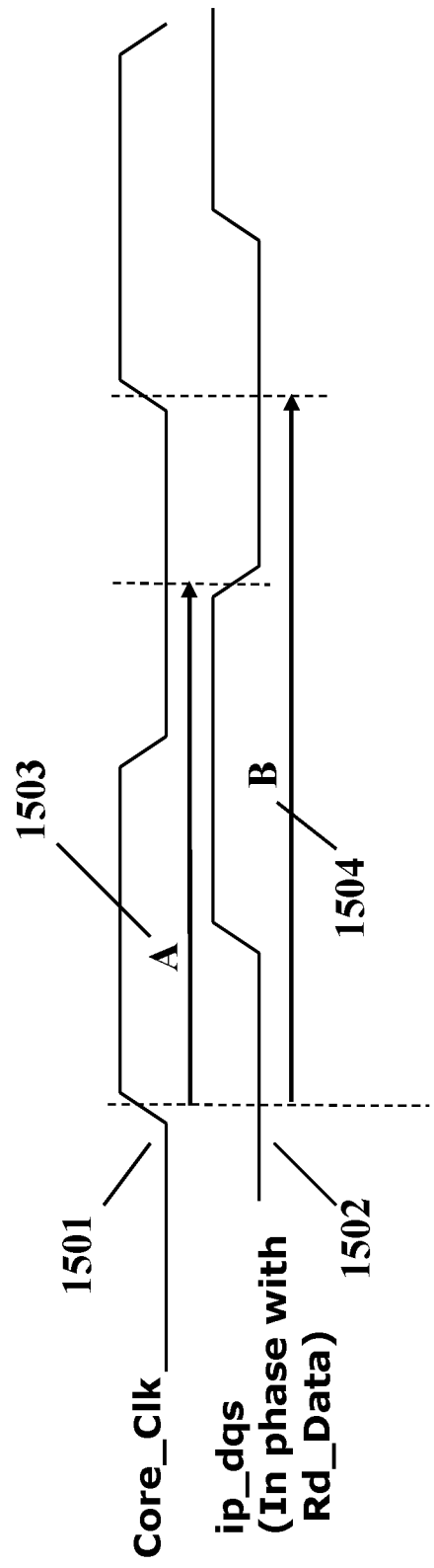
FIG. 15 shows a timing diagram where Core_Clk and ip_dqs are delayed and sampled as part of implementing a dynamically calibrated DDR controller function according to one embodiment of the invention.
Figure 16:
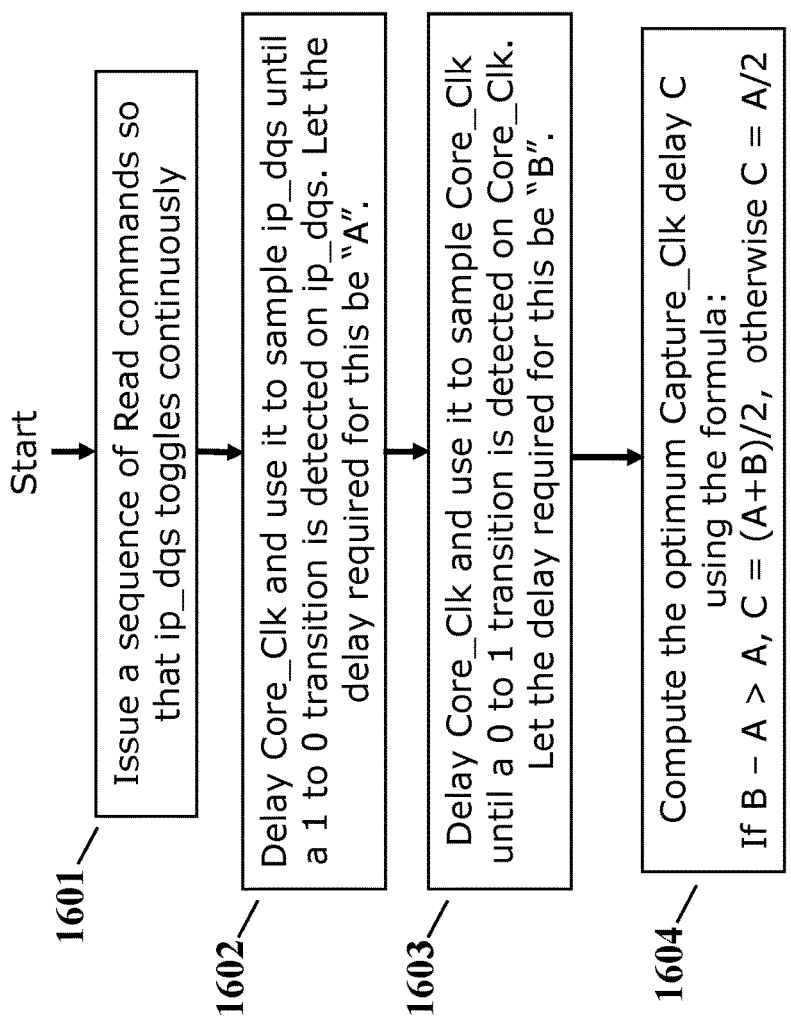
FIG. 16 shows a flowchart describing the process of delaying and sampling both ip_dqs and Core_Clk, and for computing an optimum Capture_Clk delay.

FIG. 15 graphically shows some of the timing delays that are manipulated as part of the dynamic calibration sequence of the DDR memory controller per one embodiment of the present invention and as described in FIG. 16. Here, Core_Clk 1501 is delayed by different values, here marked value "A" 1503 in FIG. 15. The ip_dqs signal 1502 is also delayed by different values, here marked value "B" 1504.

FIG. 16 shows a flowchart for the dynamic calibration procedure in order to determine an optimum delay for Core_Clk delay element 1005 in order to produce an optimum timing for the Capture_Clk signal. In step 1601, a sequence of read commands is issued so that the ip_dqs signal toggles continuously. In step 1602, the Core_Clk signal is delayed and used to sample ip_dqs at different delay increments until a 1 to 0 transition is detected on ip_dqs, whereby this value for the Core_Clk delay is recorded as value "A". In step 1603, the Core_Clk signal is delayed and used to sample Core_Clk at different delay increments until a 0 to 1 transition is detected on Core_Clk, whereby this value for the Core_Clk delay is recorded as value "B". In step 1604, the optimum delay value "C" for delaying Core_Clk in order to produce an optimum Capture_Clk signal is computed according to the formula: if B−A>A then the resulting value C=(A+B)/2, otherwise C=A/2.

Figure 17:
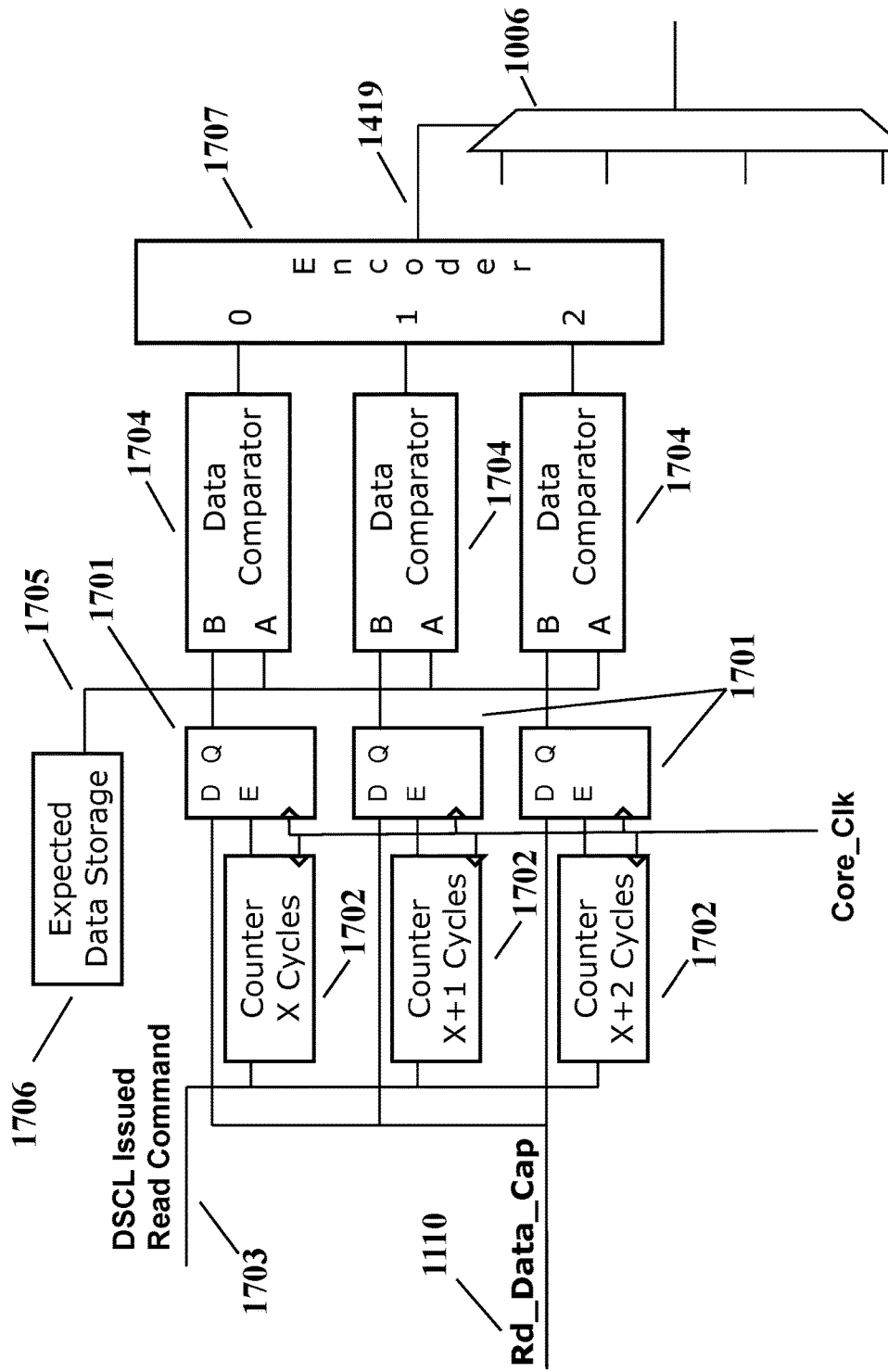
FIG. 17 includes circuitry added for dynamic calibration, in particular for a second phase according to the process of FIG. 18.
Figure 18:
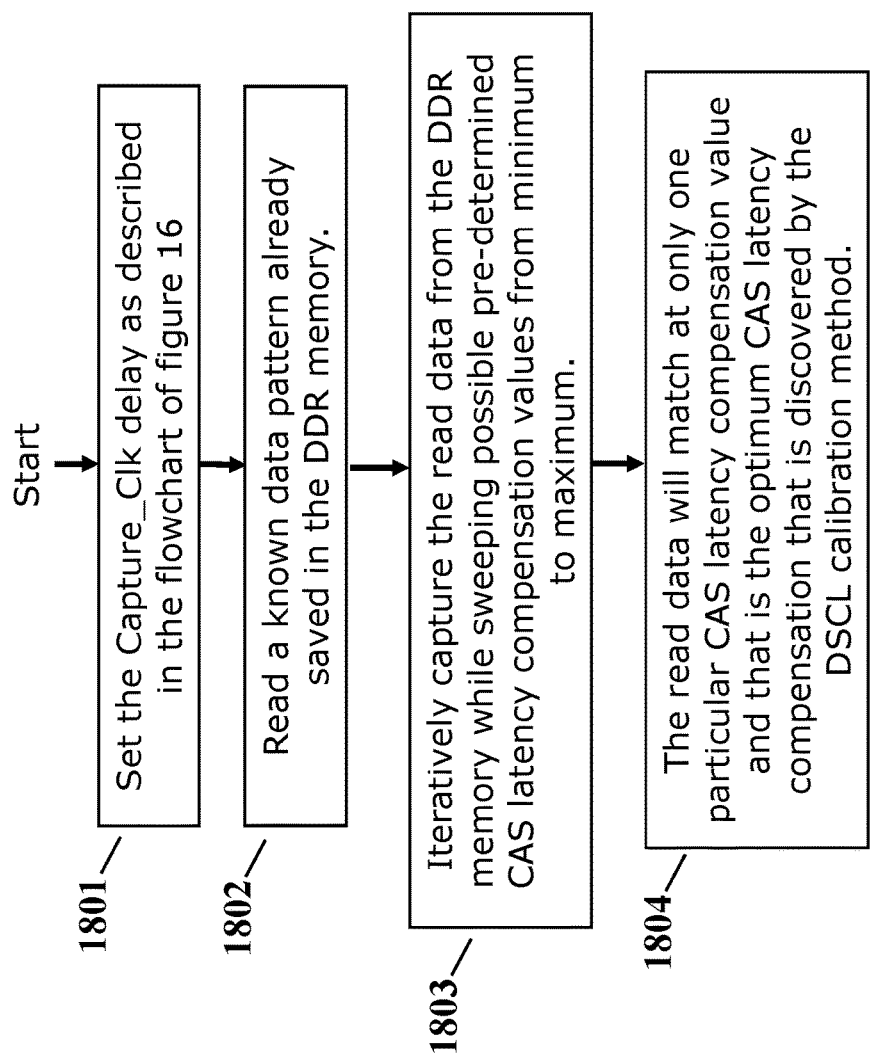
FIG. 18 shows a flowchart describing the process of iteratively capturing read data from the DDR memory while sweeping different CAS latency compensation values to determine the settings for the DDR memory controller that provide the optimum CAS latency compensation.

FIG. 17 shows the circuitry within the DSCL functionality that is utilized during the portion of the calibration sequence described in the process of FIG. 18. According to FIG. 11, read data has been captured in flip-flop 1103 by Capture_Clk to produce Rd_Data_Cap 1110. Rd_Data_Cap 1110 is then captured in each of flip-flops 1701 on an edge of Core_Clk and are enabled to register Rd_Data_Cap by one of counters 1702 which themselves are also clocked by Core_Clk. Counters 1702 are enabled to start counting by a Read Command 1703 issued by the DSCL functionality. The outputs of flip-flops 1701 each go to a data comparator 1704 where they are compared with a predefined data value 1705 which is stored in the DDR memory controller in location 1706 and has also been previously placed in the DDR memory itself as described in the process of FIG. 18. The outputs of the data comparators enter encoder 1707 whose output 1419 controls multiplexer 1006 which chooses a flip-flop chain delay path from those previously described in FIG. 7.

FIG. 18 shows a procedure for operating the DDR memory controller in order to calibrate the controller during dynamic operation, and in particular to determine the optimum overall CAS latency compensation. First, in step 1801 the Capture_Clk delay is set to the previously determined optimum value according to the procedure described in the flowchart of FIG. 16. In step 1802 a known data pattern is read from a DDR memory connected to the DDR memory controller. This known data pattern originates in a stored location 1706 in the DDR controller device and would typically have been previously saved or located in the DDR memory. If such a pattern is not available in the DDR memory, an appropriate pattern would be written to the DDR memory before this step and subsequent steps are executed. If, in order to write such a known data pattern to the DDR memory, existing data at those memory locations needs to be preserved, the existing data may be read out and saved inside the memory controller or at another (unused) memory location, and then may be restored after the DSCL dynamic calibration sequence per FIGS. 16 and 18 is run. In step 1803 read data is captured from the DDR memory in an iterative manner while sweeping possible predetermined CAS latency compensation values from a minimum to a maximum value utilizing the different delay paths that can be chosen with the circuitry shown in FIG. 17. In step 1804, when the read data matches at a particular CAS latency compensation, the parameters and settings that produced that optimum value of CAS latency compensation, i.e. the chosen delay path through the flip-flop chains feeding multiplexer 706 in combination with the previously determined optimum Capture_Clk delay, are recorded as the optimum parameters for the CAS latency compensation value and used thereafter during normal operation until another dynamic calibration sequence is performed.

Half-Frequency Operation and Dual-Mode DQS Gating

Circuits and methods are described for a DDR memory controller where two different DQS gating modes are utilized. These gating modes together ensure that the DQS signal, driven by a DDR memory to the memory controller, is only available when read data is valid, thus eliminating capture of undesirable data into the memory controller caused by glitches when DQS is floating. Two types of gating logic are used: Initial DQS gating logic, and Functional DQS gating logic. The Initial gating logic has additional margin to allow for the unknown round trip timing during initial bit levelling calibration. Eventually the memory controller will establish precise timing in view of the actual round-trip delay. Round trip delay is the difference between the instant when a read command is issued by the memory controller and the instant when the corresponding data from a DDR memory is received at the memory controller excluding the known and fixed number of clock cycle delays involved in fetching data in the DDR protocol. Even though this round trip delay has not been characterized when initial bit-levelling calibration is performed, it is useful to perform bit-levelling early in the overall calibration process as this makes subsequent phase and latency calibration for data capture more precise and consistent across all data bits. During bit-levelling calibration an alternating pattern of 1s and 0s is read from the memory and the memory controller is able to perform bit-levelling regardless of the round-trip delay due to the predictable nature of the pattern and the manner in which bit-leveling calibration operates. This does, however, require a wider window for DQS gating and hence the Initial gating mode as described herein is used. Please see co-pending U.S. application Ser. No. 13/797,200 for details on calibration for bit-levelling. DQS functional gating is optimized to gate DQS precisely as Capture_Clk delay and CAS latency compensation calibration is performed. This gating functionality is especially useful when data capture into a core clock domain is performed at half the DQS frequency in view of rising clock rates for DDR memories.

With newer DDR technologies, memory speeds are becoming faster and faster. This means that the period of the clocks are becoming smaller and smaller. This is problematic for successful data capture because the related timing windows also become smaller. By operating with some of the clocks involved in data capture at the half frequency, as well as other associated logic, the size of these timing windows can be increased. Whereas while operating at full frequency, SCL could theoretically choose a position for Capture_Clk in such a way that input DQS gating is not necessary, when running at half frequency such an option no longer exists. This is because the input DQS needs to be divided to half its frequency using a toggling flip-flop to produce a signal shown as d1_half_rate_dqs 2103 in FIG. 21. If d1_half_rate_dqs were to toggle because of a spurious noise pulse on input DQS 1903 in FIG. 19, or when DQS is toggling at other times not corresponding to a valid input being driven from the DRAM 1904, then it could have an opposite polarity from what is required to latch the input data from the DRAM correctly.

Especially when some of the capture-related clocks and logic are operated at half frequency, it can become problematic during a first run of bit-levelling calibration when the gating for input DQS 1902 may not yet be perfect. In such a condition, it may be unclear how to best open/close DQS gating, since write side bit-levelling may need the gate to be open either perfectly or for more time. An initial gating strategy is therefore used for the first bit-levelling calibration because it is more lenient in that it will leave the gate open for a larger amount of time before closing it. This does not cause a problem for the bit-leveling function to work properly since it does not depend on d1_half_rate_dqs to perform its function. This capability and extra margin is not needed after SCL calibration is performed, as described earlier in this specification with respect to Self-Configuring Logic 1001, because the gating can then be programmed more precisely within the functional gating mode using the information obtained by SCL.

This capability to use two gating modes of operation is also useful for an implementation even where the clocks are operated at full frequency, in view of the smaller available timing margins as memory access clock speeds continue to rise from year to year.

Figure 19:
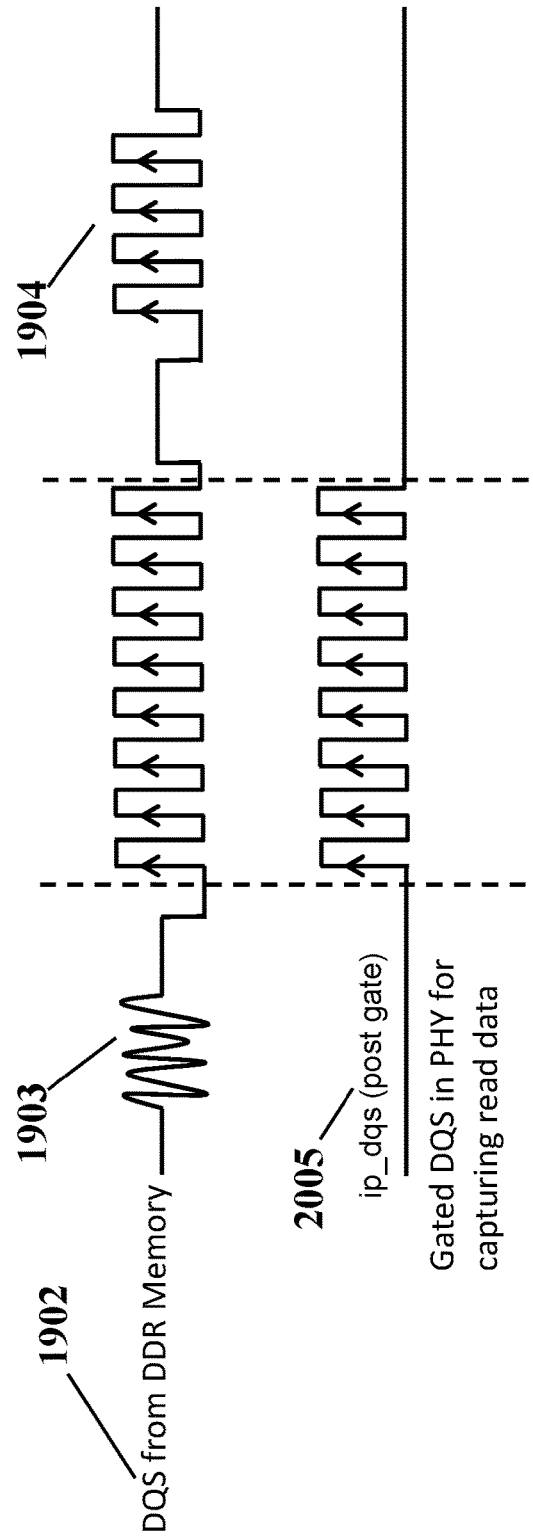
FIGS. 19-22 show circuit details and timing relationships for providing a memory interface that includes two different windows for gating key timing signals like DQS—a first that is large and allows for performing initial calibration functions when the precise timing is not yet known, and a second for gating key timing signals more precisely as timing relationships become more defined as the calibration process progresses.
Figure 20:
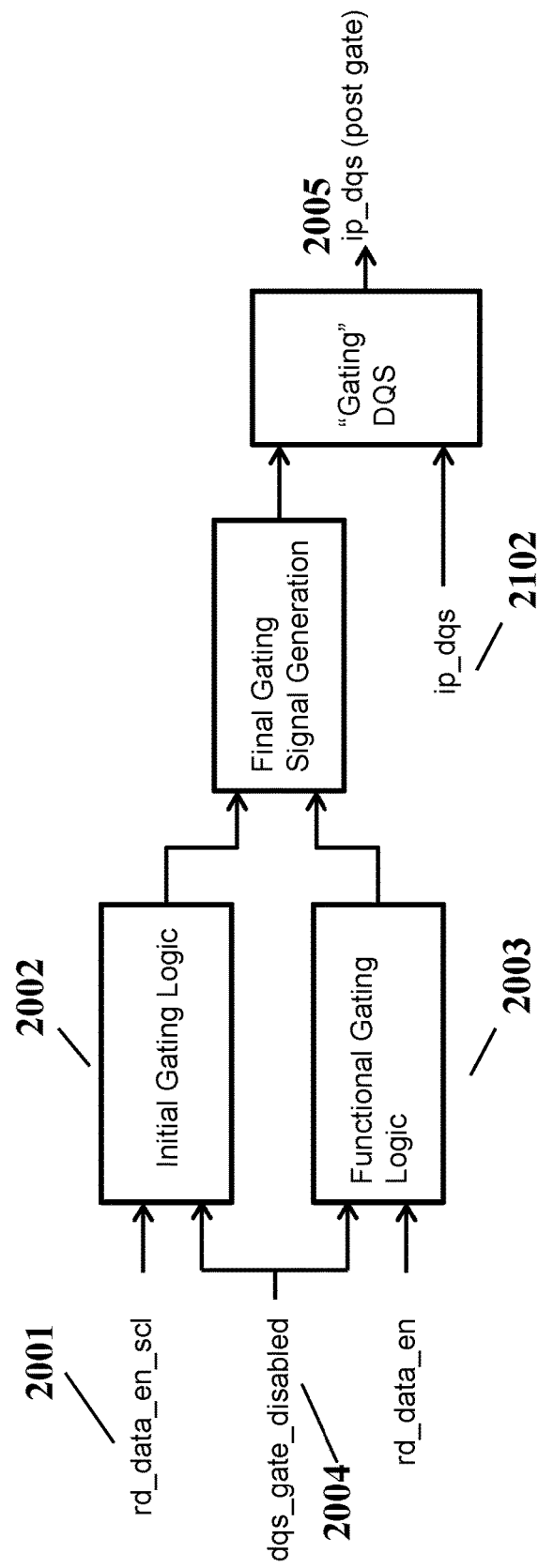

The waveform of FIG. 19 shows a hypothetical example of the goal of DQS Gating by only allowing the DQS pulses that correspond to the issued read command to be operated on by the memory controller. As shown in FIG. 20, there are two types of gating logic, the Initial gating logic 2002, and the Functional gating logic 2003. The difference between the two is how precisely they work. The Initial gating logic 2002 has additional margin to allow for the unknown input DQS round trip timing during initial bit-levelling calibration. The Functional gating logic 2003 gates DQS precisely based on the round trip timing information discovered and refined during SCL calibration. Regardless of which gating logic is active, either 2002 or 2003, the resulting output is a gated ip_dqs called ip_dqs (post gate) 2005. There is also a disable control 2004 that can be used which forgoes gating but it is not advised to turn it on with half-frequency mode since glitches can invert the phase of the divided DQS.

FIG. 20 shows a high-level block diagram representation for the logic used for both Initial DQS gating 2002 and for Functional DQS gating 2003. The Initial gating mode is only used for the first time that bit-levelling calibration is run. At this initial point in the calibration process, SCL calibration has not yet been run. Therefore the Functional gate timing would be imprecise if used at this stage of the calibration process. After the first time bit levelling is run using Initial DQS gating, Functional gating mode is used during SCL calibration and for functional operation after determination of precise timing values for Capture_clk 2105 and CAS latency calibration. Thereafter, whenever bit levelling or dynamic SCL calibration are run from time to time during functional system operation, the Functional gating timing is used.

Functional gating timing has not been optimized prior to the first run of SCL calibration for optimizing Capture_clk 2105 timing. During the first run of SCL calibration, the gate opening timing is not precise, so it is possible that for half-frequency operation—for applications where half-frequency functionality according to the present invention is used—the divided input DQS, called d1_half_rate_dqs 2103, has the opposite phase from what is required. This situation is automatically detected and corrected by SCL calibration as described below with respect to SCL Clock Domain Crossing. After SCL calibration has completed, the just discovered Capture_Clk and CAS latency settings are used to close the gate precisely, for functional operation and for any further calibration operations.

SCL Clock Domain Crossing and Half-Frequency Capture Logic

Figure 21:
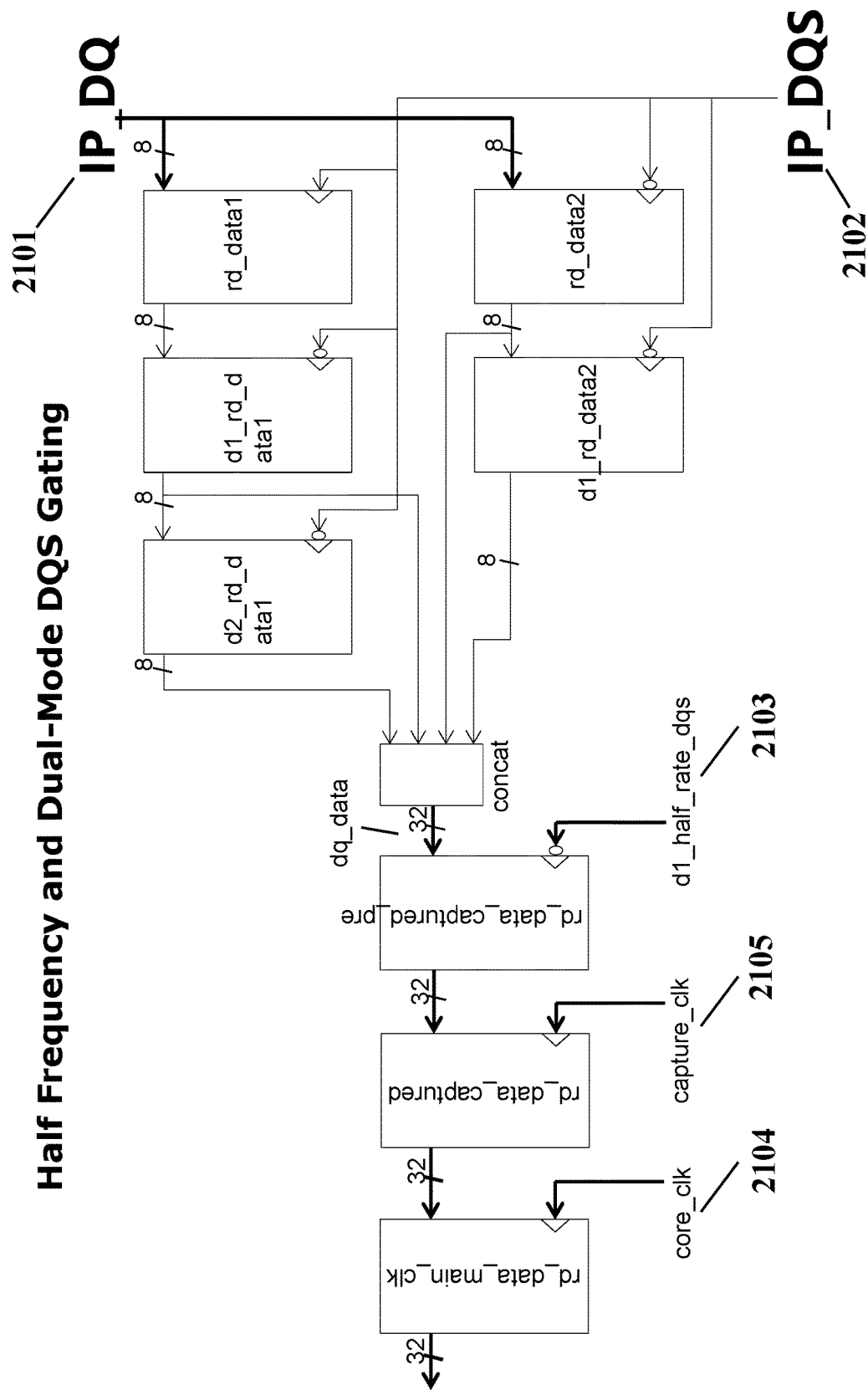
Figure 22:
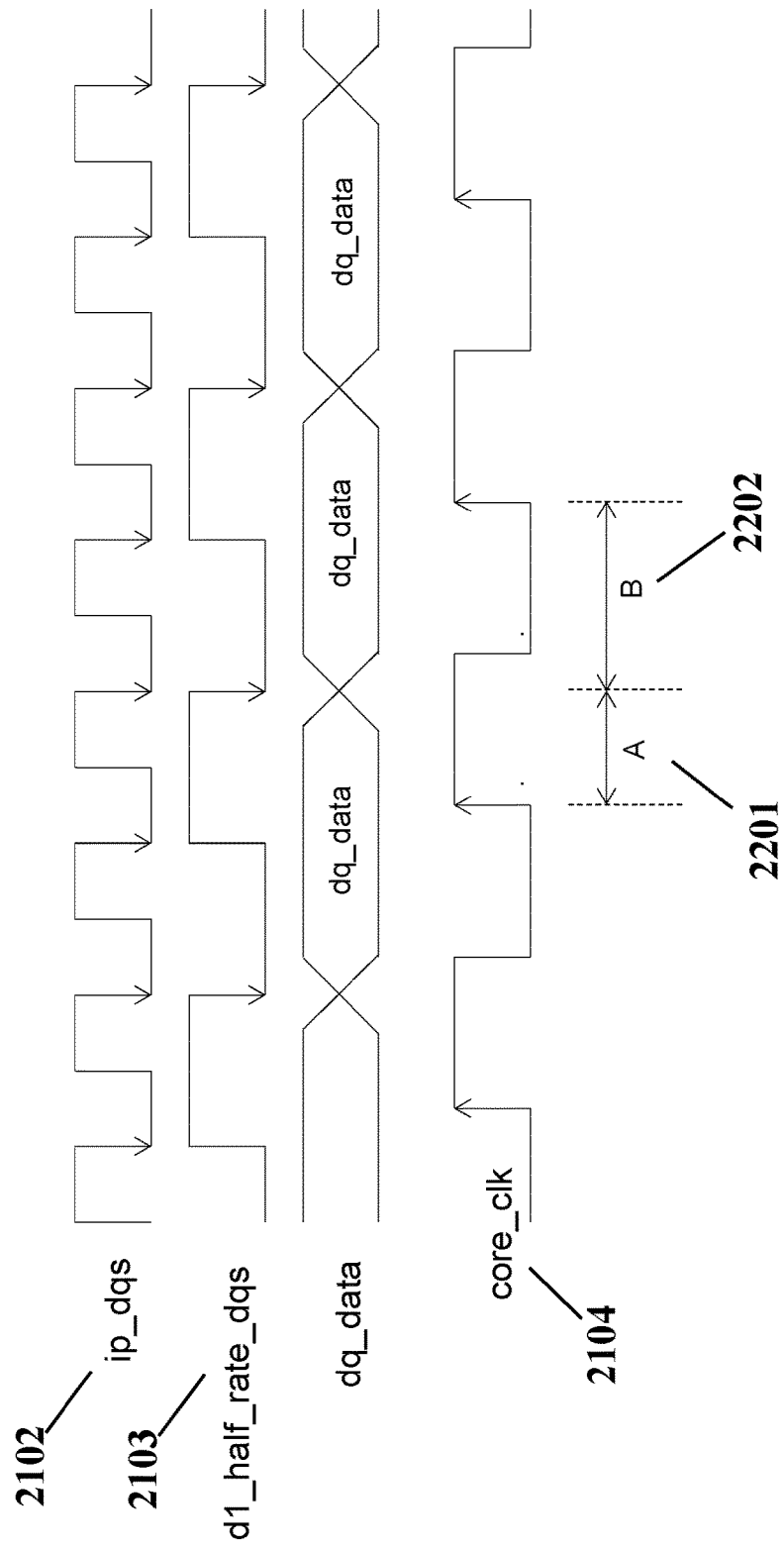

One exemplary circuit used to implement the read capture logic is shown in FIG. 21 for applications where half-frequency functionality according to the present invention is used. As described earlier in this specification, capture_clk 2105 is the variable delay clock which SCL will tune so that there is optimal setup and hold margins for clocking data from the input DDR3/DDR4 strobe domain to the memory controller's core clock domain, where it is captured by core_clk 2104.

During SCL operation, the memory controller will continuously look for the location of the second falling edge of ip_dqs 2102. This is the edge in which valid data on ip_dq 2101 will be available. The data will cross clock domains from this edge to the falling edge of d1_half_rate_dqs 2103 which happens on the same edge of ip_dqs that triggered d1_half_rate_dqs to go low. This is done to reduce latency on the read path but it must be noted that to check timing based on this, a multi-cycle path of zero is used to time the path during Static Timing Analysis. SCL will find the center between the rising edge of core_clk and the falling edge of the next d1_half_rate_dqs strobe, shown by points A 2201 and B 2202 in the FIG. 22. Whichever point gives the largest setup and hold margins—point B in the example below—will be set as the active edge location for capture_clk.

Phase Fixing

As described above, valid read data is available after the second falling edge of ip_dqs or the falling edge of the divided DQS, d1_half_rate_dqs. It is possible that d1_half_rate_dqs could start or become out of phase. If out of phase, the data read back will not be correct. SCL calibration has the ability to detect this situation. Once SCL finishes calibration, it will check to see if it failed or not. If it passed, the phase is correct and normal functionality will follow. If it failed, SCL will run CAS latency calibration again after flipping the polarity of d1_half_rate_dqs placing it back into phase. The setting for Capture_Clk will also be recalculated by moving point A in FIG. 22 either forward or backward by 1 cycle of ip_dqs based on whether A is lesser or greater than one cycle of ip_dqs.

Logic for Initial Gating During Initial Bit Levelling Calibration

In the Initial gating mode, the gate is extended 8 full rate cycles beyond the falling edge of rd_data_en_scl 2001 to ensure maximum round trip delay in receiving valid DQS pulses is accounted for. This is exemplary, and extension by other numbers of full rate cycles is possible.

Figure 23:
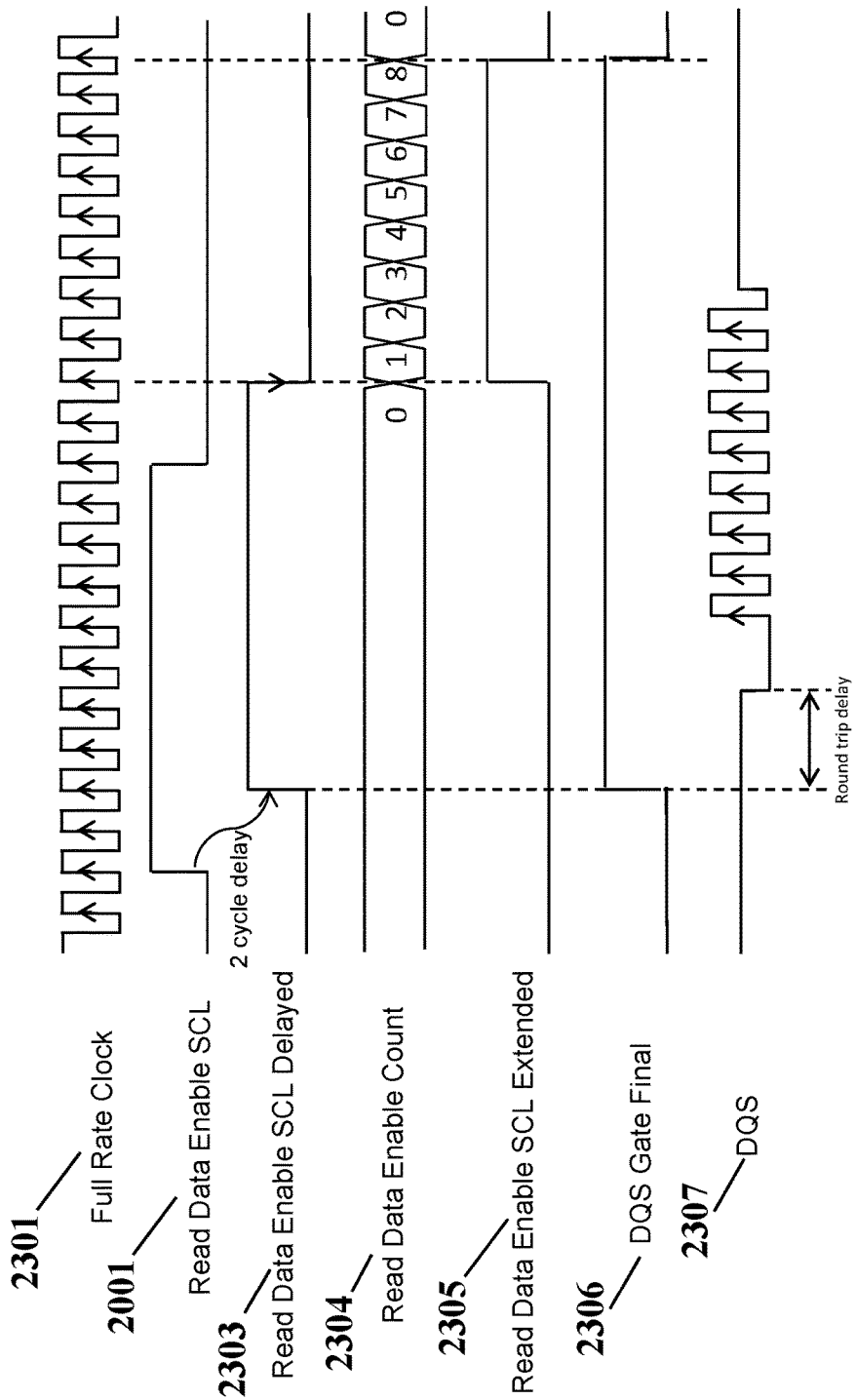

FIG. 23, shows an example timing diagram of the fundamental signals in initial ABC gating routine to create the final gating signal. The signals shown in FIG. 23 are defined as follows:

Full Rate Clock 2301: One of two clock domains in the memory controller with the same frequency as ip_dqs and is used sparingly as some portions of the memory controller must be in the full rate domain.

Read Data Enable SCL 2001: Read enable signal from the memory controller which is used for calibration purposes and to control the DQS gate signal.

Read Data Enable SCL Delayed 2303: This is the read data enable SCL signal but delayed by two full rate cycles.

Read Data Enable Count 2304: A counter which is used to extend the final DQS gate signal by eight full rate cycles.

Read Data Enable SCL Extended 2305: A one bit signal derived from the read data enable count to extend the final DQS gate by eight cycles.

DQS Gate Final 2306: This signal will gate DQS but it has no concept of round trip time and therefore opens earlier and closes later giving more margins. (NOTE: this signal is the same one used for functional gating, but the logic to have the gate open/close is different since the round trip time is known)

DQS 2307: The incoming DQS from the memory.

Note that in FIG. 23 the round trip delay here looks relatively small as the drawing has been simplified. Round trip delay is the time it takes for the read data and strobe to be received at the memory controller after the memory has received the read address and command issued by the memory controller. The read data enable SCL delayed signal will open before the DQS strobe is received by the memory controller as it is much more lenient.

Before SCL calibration has been run, the memory controller does not know anything about the round trip time and therefore the gate will not open/close perfectly. This is why Initial gating mode is used since it is much more lenient on when it opens and closes the gate, thus not interfering with bit levelling calibration. Again, Initial gating mode in half frequency mode is only used during the initial run of bit levelling calibration for both the read and write side. When the memory controller is going start reading data for calibration, it will generate a read data enable signal which takes in account the read latency of the memory. When this read data enable signal is used for gating, it is delayed further by two cycles. This is exemplary and could be delayed more or less. The delayed version of the read data enable signal will open the gate albeit a bit earlier than the time when the DQS from the memory reaches the memory controller. At the falling edge of the delayed read data enable signal, the memory controller will extend the gating signal by 8 full rate cycles and then will close it. The position at which it closes will be after the DQS has arrived at the memory controller from the memory.

Logic for Functional Gating (Functional Gating Logic)

The logic for generating the functional gating signal is more intricate. It is necessary to being gating shortly before the rising edge of the first DQS pulse during the preamble and to stop gating shortly after the last falling edge during the postamble as shown in FIG. 25.

Figure 24:
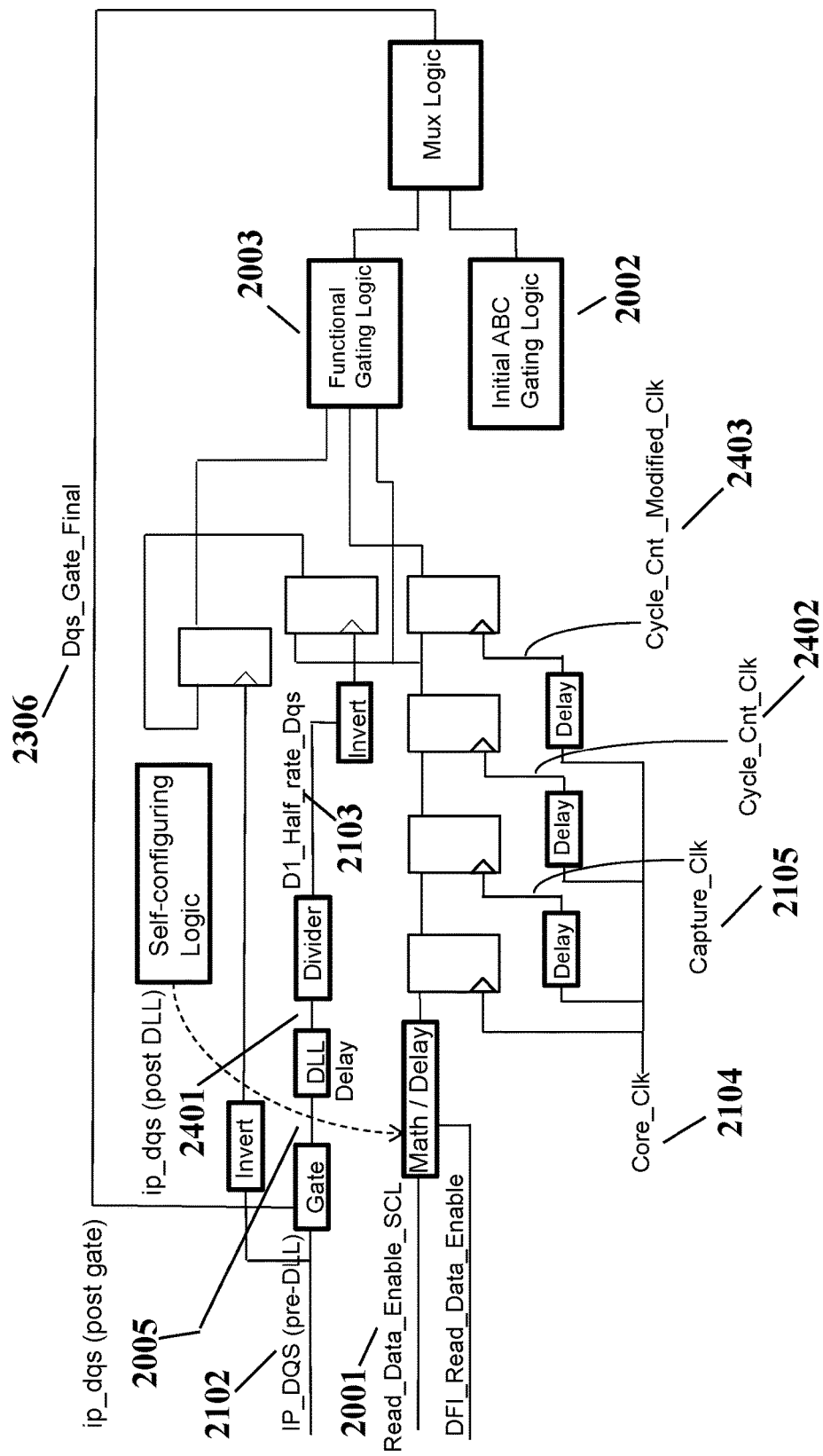
Figure 25:
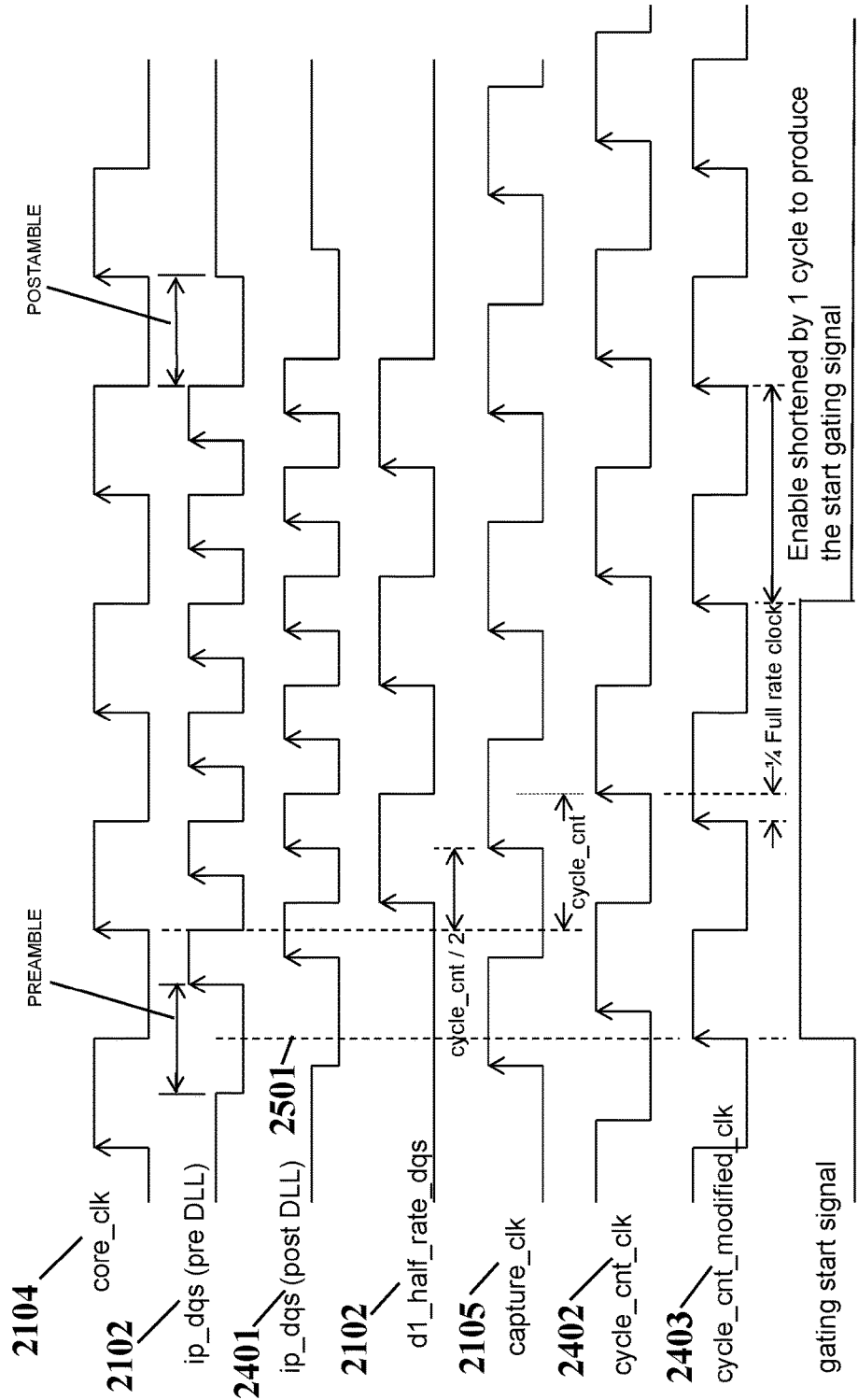

How each of the gating logic functions fits in the overall memory interface according to the invention is shown in the schematic block diagram per FIG. 24 in conjunction with the timing diagram of FIG. 25.

Gate Opening Timing for Functional Gating

Per FIG. 25, in order to begin gating just before the first pulse of DQS, it must be determined when the first pulse actually occurs with respect to something that is known. Note that there is also an analog or digital DLL that is used to delay the input DQS by ¼ cycle for centering it with respect to DQ. The waveforms of FIG. 25 show the timing of the gating signal with respect to ip_dqs prior 2102 to being delayed by the DLL (pre DLL) as well as after being delayed 2401 by the DLL (post DLL). In FIG. 25 with respect to half-frequency operation, d1_half_rate_dqs 2103 is a divided version of ip_dqs (post DLL) 2401 which toggles on every falling edge of ip_dqs (post DLL). When SCL calibration runs, it determines the phase difference between the rising edge of core_clk 2104 and the falling edge of d1_half_rate_dqs 2103 which corresponds to the second falling edge of ip_dqs (post DLL) 2401 and stores this value as a variable called cycle_cnt (this is the same as the SCL measurement point A mentioned previously with respect to FIG. 22). Therefore the invention uses cycle_cnt as a reference to determine when ip_dqs will pulse with respect to core_clk so gating can being beforehand.

First cycle_cnt_clk 2402 is created by delaying core_clock by the value cycle_cnt. This new clock (cycle_cnt_clk) has each positive edge aligned to each second falling edge of ip_dqs (post DLL). Another clock, cycle_cnt_modified_clk 2403 is generated ¼ Full rate clock cycle sooner or one and ¾ Full rate clock cycle later than cycle_cnt_clk (depending on whether cycle_cnt is greater than ¼ Full rate clock cycle or less than ¼ cycle respectively).

It can be seen that each positive edge of cycle_cnt_modified_clk 2403 is aligned to each second falling edge of ip_dqs (pre DLL) 2102 and is therefore centered in the middle of ip_dqs preamble time—as shown by the dotted line 2501 in FIG. 25.

Next, the read enable signal from the controller is registered into this new cycle_cnt_modified_clk domain using capture_clk and cycle_cnt_clk as staging clocks. Capture_Clk is guaranteed by SCL calibration to be positioned so that maximum setup and hold margins are obtained when transitioning between the core_clk and cycle_cnt_clk domains. Timing from cycle_cnt_clk to cycle_cnt_modified_clk is met by design. This read enable signal, once latched in the cycle_cnt_modified_clk domain, is used to signal the start of DQS gating. The clock cycle latency of the read enable signal is also adjusted based on SCL calculated CAS latency as described previously. Also the enable signal is shortened by 1 clock cycle compared to the length of the read burst so that it does not affect the gate closing timing.

Gate Closing

Figure 26:
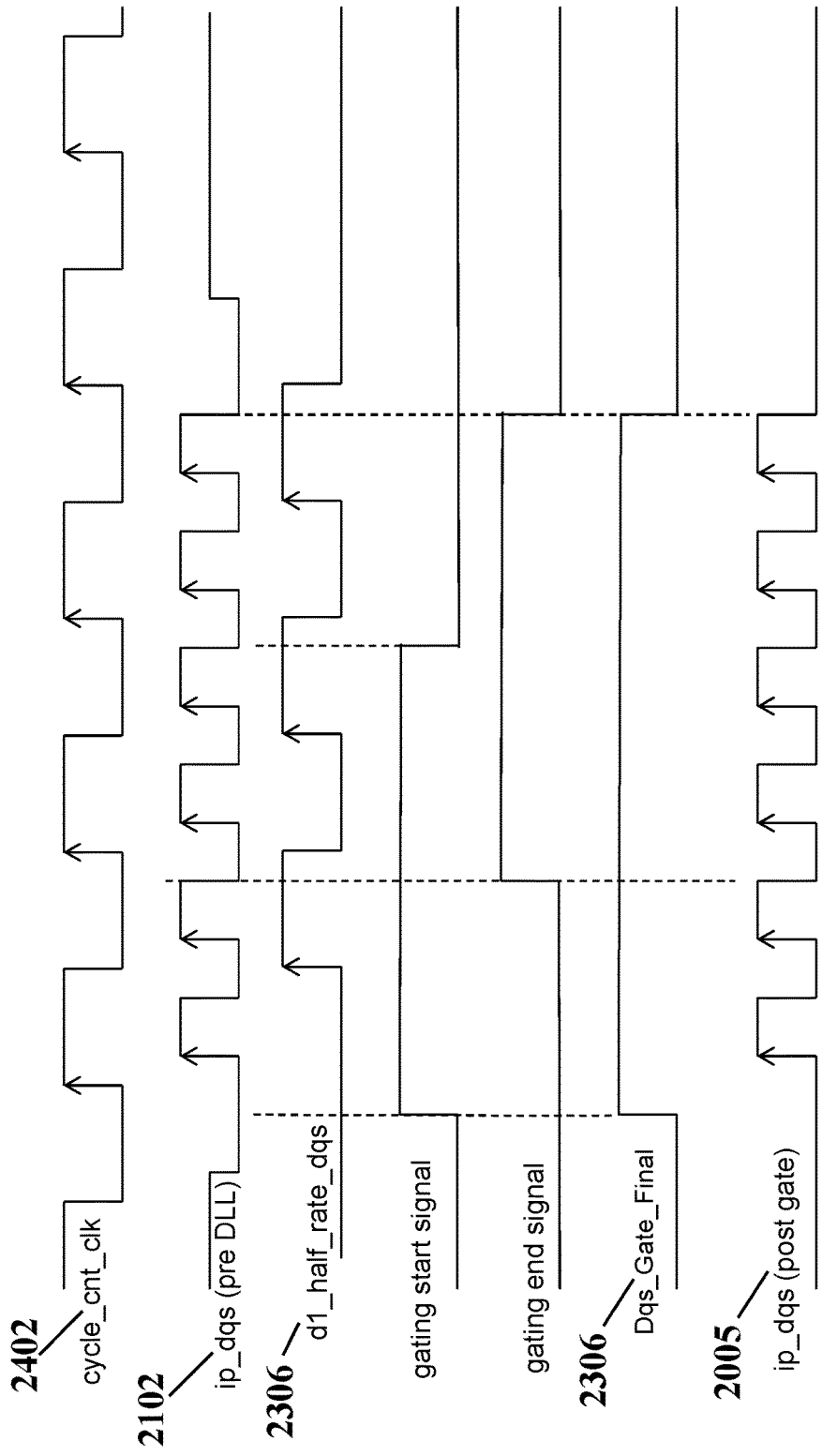

Per FIG. 26, the DQS gate is closed directly by the last falling edge of the final DQS pulse. This is done by latching the third staged read data enable signal (in cycle_cnt_clk domain) into the d1_half_rate_dqs domain.

Thus, the foregoing description of preferred embodiments of the present invention has been provided for the purposes of illustration and description. It is not intended to be exhaustive or to limit the invention to the precise forms disclosed. Many modifications and variations will be apparent to one of ordinary skill in the relevant arts. For example, unless otherwise specified, steps performed in the embodiments of the invention disclosed can be performed in alternate orders, certain steps can be omitted, and additional steps can be added. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A computer-implemented method for calibrating capturing read data in a read data path for a double data rate (DDR) memory interface circuit comprising:
    delaying at least one aspect of a core clock signal by a capture clock delay value to produce a capture clock signal, wherein the capture clock signal is a delayed version of the core clock signal; and
    determining the capture clock delay value;
    wherein timing for the read data path with respect to data propagation is responsive to at least the capture clock signal.

2. The method of claim 1, wherein an output of the read data path is clocked by the core clock signal.

3. The method of claim 1, further comprising:
    using a sequence of read commands causing a read data strobe (DQS) signal to be produced.

4. The method of claim 1, wherein the method is performed independently and in parallel for each of a plurality of byte lanes.

5. The method of claim 1, wherein test data is read during performance of the calibration method.

6. The method of claim 4, wherein test data is stored in the DDR memory prior to performing the calibration method.

7. The method of claim 4, further comprising:
    reading the test data using one or more delay settings to determine the capture clock delay value.

8. The method of claim 6, wherein the capture clock delay value satisfies a minimum passing window requirement to capture the read data.

9. The method of claim 6, wherein the capture clock delay value positions the capture clock signal within a largest passing window to capture the read data.

10. The method of claim 1, wherein the calibration method is performed upon power-on of a system containing the DDR memory interface circuit.

11. The method of claim 5, further comprising:
    running a read data capture test using at least a portion of the test data for at least one increment of delay tap setting for a core clock delay element;
    from at least a result of the read data capture test, choosing the delay tap setting that positions the capture clock signal within a largest passing window to capture the read data; and
    programming the chosen delay tap setting into control registers in the DDR memory interface circuit.

12. The method of claim 10, further comprising:
    running a read data capture test for at least one byte lane.

13. The method of claim 12, further comprising:
    running the read data capture test independently and in parallel for each of a plurality of byte lanes.

14. The method of claim 10, further comprising:
    running a read data capture test for at least one increment of CAS latency.

15. The method of claim 10, further comprising:
    running a read data capture test for at least one increment of CAS latency and for at least one byte lane.

16. The method of claim 1, wherein a CAS latency compensation circuit is clocked solely by the core clock.

17. The method of claim 1, further comprising:
    delaying the read data path by a programmable number of cycles of the core clock to compensate for CAS latency characteristics of a particular system installation;
    wherein said programmable number of cycles is determined during operation of the calibration method.

18. A computer-implemented method of controlling timing for a read data path for a double data rate (DDR) memory interface circuit comprising:
    producing a third signal based on comparison of timing of a first signal and a second signal with respect to each other; and
    using the third signal for timing of the read data path,
    wherein the first signal is a core clock signal or a signal derived from at least the core clock signal;
    wherein the second signal is a read data strobe signal or a signal derived from at least a read data strobe signal; and
    wherein the first signal is used in moving read data into a core clock domain.

19. The method of claim 18, further comprising:
    using a sequence of read commands causing the second signal to be produced.

20. The method of claim 19, wherein the second signal is delayed.

21. The method of claim 18, wherein the third signal is a capture clock signal.

22. The method of claim 18, wherein the third signal is a delayed version of the first signal.

23. The method of claim 22, further comprising:
    determining a delay value by which to delay the first signal with respect to at least the second signal to produce the third signal.

24. The method of claim 23, wherein the delay value allows the third signal to be optimally positioned with respect to the second signal.

25. The method of claim 18, wherein the third signal is a delayed version of the second signal.

26. The method of claim 25, further comprising:
    determining a delay value by which to delay the second signal with respect to at least the first signal to produce the third signal.

27. The method of claim 26, wherein the delay value allows the third signal to be optimally positioned with respect to the second signal.

28. A computer-implemented method of controlling timing for a read data path for a double data rate (DDR) memory interface circuit comprising:
    producing a third signal based on comparison of timing of a first signal and a second signal with respect to each other; and
    using the third signal for timing of the read data path;
    wherein the first signal is a core clock signal or a signal derived from at least the core clock signal;
    wherein the second signal is a read data signal or a signal derived from at least a read data signal; and
    wherein the first signal is used in moving read data into a core clock domain.

29. The method of claim 28, further comprising:
    using a sequence of read commands causing the second signal to be produced.

30. The method of claim 29, wherein the second signal is delayed.

31. The method of claim 28, wherein the third signal is a capture clock signal.

32. The method of claim 28, wherein the third signal is a delayed version of the first signal.

33. The method of claim 32, further comprising:
determining a delay value by which to delay the first signal with respect to at least the second signal to produce the third signal.

34. The method of claim 33, wherein the delay value allows the third signal to be optimally positioned with respect to the second signal.

35. The method of claim 28, wherein the third signal is a delayed version of the second signal.

36. The method of claim 35, further comprising:
determining a delay value by which to delay the second signal with respect to at least the first signal to produce the third signal.

37. The method of claim 36, wherein the delay value allows the third signal to be optimally positioned with respect to the second signal.

38. The method of claim 1, and further comprising:
programmably delaying a data strobe (DQS) signal.

39. The method of claim 38, further comprising:
capturing the read data at times corresponding to both rising and falling edges of a data strobe (DQS) signal.

40. The method of claim 38, wherein the DDR memory interface circuit includes a DDR memory controller configured to be connected to one or more DDR memory components.

41. The method of claim 38, further comprising:
minimizing a latency in moving the read data from a first clock domain to a second clock domain.

42. The method of claim 38, wherein input read data, when input in the read data path, is in a first clock domain; and the captured read data, after being captured in the read data path, is in a second clock domain.

43. The method of claim 42, wherein the first clock domain is a DQS clock domain, and the second clock domain is a core clock domain.

44. The method of claim 43, wherein the capturing is performed on the input read data.

45. The method of claim 43, wherein the captured read data is synchronized to the core clock signal.

46. The method of claim 38, wherein the calibrating is performed by a self-configuring logic circuit (SCL) contained within the DDR memory interface circuit.

47. The method of claim 46, wherein the self-configuring logic circuit (SCL) programs a data strobe (DQS) delay of at least one DQS signal using a DQS delay element.

48. The method of claim 47, wherein the programming of the DQS signal delay is performed during a power-on initialization operation of the DDR memory interface circuit.

49. The method of claim 48, wherein the self-configuring logic circuit (SCL) receives input from at least a timing of at least one of read data input to the read data path, captured read data in the read data path, or synchronized read data in the read data path.

50. The method of claim 38, wherein the DDR memory interface circuit is configured to be connected to a DDR memory circuit and is further configured to be clocked by a memory clock, and wherein the capture clock signal has a same frequency as the memory clock.

51. The method of claim 38, wherein the DDR memory interface circuit is configured to be connected to a DDR memory circuit and is further configured to be clocked by a memory clock signal, and wherein the core clock signal has a same frequency as the memory clock signal.

52. The method of claim 38, wherein a timing of the capture clock signal is adjusted such that a positive active edge of the capture clock signal and a negative active edge of the capture clock signal are positioned such that a data capture occurs at a time in a data (DQ) valid window.

53. The method of claim 5, further comprising:
running a read data capture test using at least a portion of the test data for at least one change of a delay setting for the capture clock delay value;
from at least a result of the read data capture test, choosing the delay setting so as to position an active edge of the capture clock signal in a valid window to capture the read data; and
programming the chosen delay setting into one or more control registers in the DDR memory interface circuit.

54. The method of claim 4, further comprising:
for each one or more byte lanes, run, in one or more loops, one or more read data capture calibrations using one or more pre-determined calibration data patterns and record one or more read data capture calibration results;
from at least one of the recorded one or more read data capture calibration results of at least one of the one or more loops, determine a capture clock delay value tap setting that positions an active edge of the capture clock signal in a passing window; and
store the determined capture clock delay value tap setting in the DDR memory interface circuit.

55. The method of claim 54, wherein the clock delay value tap setting centers the active edge of the capture clock signal in the passing window.

56. The method of claim 1, further comprising:
determining at least a portion of a time between a read request leaving the DDR memory interface circuit and a resulting data arriving at the DDR memory interface circuit.

57. The method of claim 56, further comprising:
based on the determination of the least portion of the time, delaying the read data path by a programmable delay to compensate for a round-trip latency characteristic of a particular system installation;
wherein the programmable delay is determined as a part of the calibration method.

58. The method of claim 1, further comprising:
dynamically determining a round-trip delay time between a first time of a read request being issued by the DDR memory interface circuit and a second time of a resulting data being received at the DDR memory interface circuit, where the resulting data corresponds to the read request.

59. The method of claim 58, wherein the dynamic determination of the round-trip delay time is carried out utilizing logic to adjust a programmable delay in the read path of the DDR memory interface circuit, and the adjustment of the programmable delay is performed at different times during a test in order to compensate for the round-trip delay time.

60. The method of claim 59, wherein the dynamic determination of the round-trip delay time is performed for each of a plurality of data strobe (DQS) signal grouping byte lanes.

61. The method of claim 1, further comprising:
calibrating a read data path round-trip delay time by executing one or more sets of one or more read data test commands;

for each set of the one or more read data test commands, setting a variable read round-trip delay compensation value measured in clock cycles;

for at least one set of the one or more read data test commands, setting the variable read round-trip delay compensation value to an initial value in a range of values;

for each set of the one or more read data test commands, adjusting the variable read round-trip delay compensation value by one clock cycle;

for at least one set of the one or more read data test commands, setting the variable read round-trip delay compensation value to a final value in the range of values; and for each set of the one or more read data test commands with the variable read round-trip delay compensation value set to at least one value in the range of values:
determining a pass result or a fail result for each read data test command, and
using the variable read round-trip delay compensation value corresponding to at least one pass result to program the DDR memory interface circuit.

62. The method of claim 61, wherein the variable read round-trip delay compensation value compensates for at least a portion of one or more delays in the read data path round-trip delay time over and above a memory column address strobe (CAS) latency.

63. The method of claim 61, wherein the variable read round-trip delay compensation value is at least a memory column address strobe (CAS) latency.

64. The method of claim 61, wherein the read data path round-trip delay time is a function of at least a memory column address strobe (CAS) latency.

65. The method of claim 1, further comprising:
calibrating a read data path round-trip delay time by running one or more sets of one or more read data test commands;
for each set of the one or more read data test commands, changing a delay in the read data path, where each changed delay corresponds to a single clock cycle of the core clock signal, a first clock signal used to derive the core clock signal, or a second clock signal derived from the first clock signal;
determining a pass result or a fail result for at least one of the one or more read data test commands of at least one of the one or more sets; and
using the changed delay corresponding to at least one pass result, during operation of the read data path of the DDR memory interface circuit.

66. The method of claim 65, wherein the changing of the delay is performed by selecting a delay path in the read data path selected from one or more delay paths of the DDR memory interface circuit.

67. The method of claim 65, wherein the changing of the delay is performed by programming a delay in a programmable delay path in the read data path of the DDR memory interface circuit.

68. The method of claim 65, wherein the calibration of the read data path round-trip delay time is performed during a power-on initialization operation of the DDR memory interface circuit.

69. The method of claim 65, wherein each set of the one or more read data test commands is run by the memory interface circuit generating one or more read commands.

70. The method of claim 65, wherein the read data path round-trip delay time is calibrated for each of a plurality of data strobe (DQS) signal grouping byte lanes.

71. The method of claim 65, wherein the pass result or the fail result is based at least on a size of a passing window.

72. The method of claim 65, wherein the pass result or the fail result is based at least on a detection of a size of at least one passing window.

73. The method of claim 65, wherein the pass result or the fail result is based at least on a proper clocking of valid data on all read data bits in a byte lane.

74. The method of claim 65, wherein the pass result or the fail result is based at least on the read data being captured successfully.

75. The method of claim 65, wherein the pass result or the fail result is based at least on an ability of the memory interface circuit to read the read data successfully.

76. The method of claim 65, wherein the pass result or the fail result is based at least on determining a timing that allows the read data to be read successfully.

77. The method of claim 65, wherein the pass result or the fail result is based at least on a capture of a particular signal as a result of at least one of the one or more read data test commands of at least one of the one or more sets.

78. The method of claim 77, wherein the particular signal is a read data path signal.

79. The method of claim 78, wherein the read data path signal is an input to the DDR memory interface circuit.

80. The method of claim 76, wherein the determination of the timing includes determining an offset delay time between a read command and valid read data corresponding to the read command.

81. The method of claim 65, wherein the pass result or the fail result is based at least on determining a timing of a particular signal that allows the read data to be captured successfully.

82. The method of claim 65, wherein the pass result or the fail result is based at least on detecting at least one particular signal that is required to capture the read data successfully.

83. The method of claim 65, wherein the pass result or the fail result is based at least on a presence of one or more particular signals that are required to capture the read data successfully.

84. The method of claim 65, wherein the pass result or the fail result is based at least on a particular signal that indicates a presence of one or more certain signals required to capture the read data correctly.

85. The method of claim 65, wherein the pass result or the fail result is based at least on determining a timing that allows the capture clock signal to be produced.

86. The method of claim 65, wherein the pass result or the fail result is based at least on determining a timing that allows the capture clock signal to be delayed.

87. The method of claim 65, wherein the pass result or the fail result is based at least on determining a timing that allows the read data to be captured successfully.

88. The method of claim 87, wherein the determination of the timing includes determining a time offset between a first time of a read command being issued by the DDR memory interface circuit and a second time of valid read data being received at the DDR memory interface circuit, where the valid read data corresponds to the read command.

89. The method of claim 1, wherein the capture clock signal is a free-running clock.

90. The method of claim 89, further comprising:
maintaining a difference in time between a first active edge of the capture clock signal and a following active edge of the core clock signal, such that the difference in time is a function of the capture clock delay value;

wherein the difference in time is adjusted such that the active edge of the capture clock signal is positioned such that a data capture occurs at a time in a data (DQ) valid window.

91. The method of claim 90, wherein the difference in time includes the capture clock delay value.

92. The method of claim 90, wherein the difference in time varies directly with the capture clock delay value.

93. The method of claim 90, wherein the difference in time decreases with an increase in the capture clock delay value.

94. The method of claim 90, wherein the adjustment of the difference in time is performed by adjusting at least the capture clock delay value.

95. The method of claim 90, wherein a core clock domain uses: the core clock signal, a first clock signal derived from the core clock signal, a second clock signal used to derive the core clock signal, or a third clock signal derived from the second clock signal; and further wherein the first active edge is used to capture the read data in the core clock domain.

96. The method of claim 90, wherein a core clock domain uses the core clock signal, a first clock signal derived from the core clock signal, a second clock signal used to derive the core clock signal, or a third clock signal derived from the second clock signal and further wherein the following active edge is used to synchronize the read data to the core clock domain.

97. The method of claim 96, wherein the following active edge is the next active edge following the first active edge.

98. The method of claim 96, wherein the synchronization is performed by the same core clock signal for all of a plurality of byte lane groupings.

99. The method of claim 89, wherein the capture clock signal is a separate signal for each of a plurality of byte lane groupings, and each of the plurality of byte lane groupings has a separate data strobe (DQS) signal and a separate capture clock delay value.

100. The method of claim 89, wherein a difference in time is maintained between an active edge of the capture clock signal and a following active edge of the core clock signal, such that the difference in time is a function of the capture clock delay value.

101. The method of claim 100, wherein the following active edge of the core clock signal is a particular active edge that follows the active edge of the capture clock signal.

102. The method of claim 100, wherein the difference in time corresponds to the capture clock delay value.

103. The method of claim 100, wherein the difference in time includes the capture clock delay value.

104. The method of claim 100, wherein the difference in time varies directly with the capture clock delay value.

105. The method of claim 100, wherein the difference in time decreases with an increase in the capture clock delay value.

106. The method of claim 1, wherein the core clock signal is a free-running clock.

107. The method of claim 1, wherein a difference in time is maintained between a first active edge and a second active edge.

108. The method of claim 107, wherein the first active edge is an active edge of the capture clock signal and the second active edge is an active edge of the core clock signal.

109. The method of claim 107, wherein the first active edge is an active edge of the core clock signal and the second active edge is an active edge of the capture clock signal.

110. The method of claim 109, wherein the second active edge is a following active edge of the capture clock signal that follows the first active edge in time.

111. The method of claim 109, wherein the second active edge is a following active edge of the core clock signal that follows the first active edge in time.

112. The method of claim 1, wherein the capture clock signal is a separate signal for each of a plurality of byte lane groupings that each has a separate data strobe (DQS) signal.

113. The method of claim 112, wherein each of the plurality of byte lane groupings has a separate capture clock delay value.

114. The method of claim 113, wherein data capture and synchronization is performed that comprises maintaining a difference in time between a first active edge of the capture clock signal and a following active edge of the core clock signal, such that the difference in time is a function of the capture clock delay value; and further wherein:
  the difference in time is adjusted such that the first active edge of the capture clock signal is positioned so that a data capture occurs at a time within a data DQ valid window;
  a core clock domain uses the core clock signal, a first clock signal derived from the core clock signal, a second clock signal used to derive the core clock signal, or a third clock signal derived from the second clock signal;
  the data capture transfers the read data to the core clock domain;
  the capture clock signal is a separate signal for each of a plurality of byte lane groupings that each has a separate data strobe (DQS) signal;
  each of the plurality of byte lane groupings has a separate capture clock delay value;
  the transferred read data is synchronized to the core clock domain such that the synchronization to the core clock domain has a fixed latency that is less than or equal to two cycles of the core clock signal, and further such that the synchronization to the core clock domain uses the core clock signal, the first clock signal, the second clock signal, or the third clock signal; and
  a clock used for synchronization to the core clock domain is used for at least one of the plurality of byte lane groupings.

115. The method of claim 114, wherein the following active edge is a next active edge following the first active edge.

116. The method of claim 113, wherein data capture and synchronization is performed that comprises maintaining a difference in time between a time of data capture and a time of synchronization, such that the difference in time is at least a function of the capture clock delay value.

117. The method of claim 116, wherein the data capture is performed using the capture clock signal or a signal derived from the capture clock signal.

118. The method of claim 116, wherein the synchronization is performed using the core clock signal, a first clock signal derived from the core clock signal, a second clock signal used to derive the core clock signal, or a third clock signal derived from the second clock signal.

119. The method of claim 116, wherein the synchronization is performed using a clock in phase with the core clock signal.

120. The method of claim 116, wherein the synchronization is performed using a synchronization clock active edge that is aligned in time with an active edge of the core clock signal.

121. The method of claim 120, wherein the synchronization clock active edge is a positive active edge or a negative active edge.

122. The method of claim 116, wherein the data capture is performed using an active edge of the capture clock signal or a capture active edge aligned in time with an active edge of the capture clock signal.

123. The method of claim 116, wherein the difference in time is a function of only the capture clock delay.

124. The method of claim 116, wherein the difference in time is a function of only the capture clock delay and a period of the capture clock signal.

125. The method of claim 116, wherein the difference in time between the time of data capture and the time of synchronization is equal to a time period of the capture clock signal minus the capture clock delay value.

126. The method of claim 116, wherein the difference in time between the time of data capture and the time of synchronization is equal in time to one or more periods of the capture clock signal minus the capture clock delay value.

127. The method of claim 116, wherein the difference in time between the time of data capture and the time of synchronization is equal to a time between a first active edge of the capture clock signal and a second active edge of the capture clock signal, minus the capture clock delay value.

128. The method of claim 113, wherein the read data is transferred from a first clock domain to a second clock domain.

129. The method of claim 128, wherein the first clock domain is clocked by the capture clock signal, a first clock signal derived from the capture clock signal, a second clock signal used to derive the capture clock signal, or a third clock signal derived from the second clock signal.

130. The method of claim 128, wherein the second clock domain is clocked by the core clock signal, a first clock signal derived from the core clock signal, a second clock signal used to derive the core clock signal, or a third clock signal derived from the second clock signal.

131. The method of claim 4, wherein the read data is transferred to a clock domain that is clocked by the core clock signal, a first clock signal derived from the core clock signal, a second clock signal used to derive the core clock signal, or a third clock signal derived from the second clock signal.

132. The method of claim 131, wherein a fixed latency delay exists between a time of read data capture using the capture clock signal and a time of transfer of the read data to the core clock domain.

133. The method of claim 132, wherein the fixed latency delay is less than or equal to three cycles of the core clock signal, the first clock signal derived from the core clock signal, the second clock signal used to derive the core clock signal, or a third clock signal derived from the second clock signal.

134. The method of claim 1, wherein data capture and synchronization is performed that comprises maintaining a phase delay between a first active edge of the capture clock signal and a following active edge of the core clock signal, such that the phase delay is adjusted by adjustment of the capture clock delay value, and further wherein:
the capture clock signal is a free-running clock;
the phase delay is adjusted such that the first active edge of the capture clock signal is centered in a read data window;
a core clock domain using a clock signal with an active edge aligned in time to an active edge of the core clock signal;
the data capture transfers the read data from a data strobe (DQS) signal clock domain to the core clock domain;
the capture clock signal is a separate signal for each of a plurality of byte lane groups that each has a separate DQS signal;
each of the plurality of byte lane groups has a separate capture clock delay value;
the transferred read data is synchronized to the core clock domain such that the synchronization to the core clock domain has a fixed latency; and
a clock used for synchronization to the core clock domain is used for at least one of the plurality of byte lane groups.

135. The method of claim 1, wherein at least one of:
said delayed version of the core clock signal results from the at least one aspect of the core clock signal being delayed;
said delayed version of the core clock signal has a first set of active edges that are delayed with respect to a second set of active edges of the core clock signal, by the capture clock delay value;
said capture clock signal has a first set of active edges that are delayed with respect to a second set of active edges of the core clock signal, by the capture clock delay value;
said at least one aspect of the core clock signal includes active edges of the core clock signal;
said at least one aspect of the core clock signal includes only active edges of the core clock signal;
said at least one aspect of the core clock signal is delayed;
said at least one aspect of the core clock signal is changed to produce the capture clock signal;
said delayed version of the core clock signal is the same frequency as the capture clock signal;
said capture clock signal is the same frequency as the capture clock signal;
said delayed version of the core clock signal is a different frequency as compared to the core clock signal;
said capture clock signal is a different frequency as compared to the core clock signal;
said version of the core clock signal is a signal derived from the core clock signal;
said version of the core clock signal is a signal used to derive the core clock signal; or
said version of the core clock signal is derived from a signal used to derive the core clock signal.

\* \* \* \* \*